(12) United States Patent
Taniguchi et al.

(10) Patent No.: US 7,023,297 B2
(45) Date of Patent: Apr. 4, 2006

(54) SURFACE ACOUSTIC WAVE BRANCHING FILTER

(75) Inventors: Norio Taniguchi, Shiga-ken (JP); Yasunori Kishimoto, Shiga-ken (JP); Mitsuyoshi Hira, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 47 days.

(21) Appl. No.: 10/811,837

(22) Filed: Mar. 30, 2004

(65) Prior Publication Data

US 2004/0227586 A1    Nov. 18, 2004

Related U.S. Application Data

(63) Continuation-in-part of application No. 10/437,239, filed on May 14, 2003, now abandoned.

(30) Foreign Application Priority Data

May 14, 2003   (JP)   ............ 2003-135329

(51) Int. Cl.
*H03H 9/72* (2006.01)
*H03H 9/64* (2006.01)

(52) U.S. Cl. ................... 333/133; 333/195
(58) Field of Classification Search ........... 333/133
See application file for complete search history.

(56) References Cited

U.S. PATENT DOCUMENTS

| | | | |
|---|---|---|---|
| 5,375,256 A | 12/1994 | Yokoyama et al. | 455/80 |
| 5,561,406 A | 10/1996 | Ikata et al. | 333/126 |
| 6,111,478 A | 8/2000 | Furutani et al. | 333/174 |
| 6,222,426 B1 * | 4/2001 | Komazaki et al. | 333/133 |
| 6,373,350 B1 * | 4/2002 | Fujita | 333/133 |
| 6,404,303 B1 | 6/2002 | Kuroda | 333/193 |
| 6,489,860 B1 | 12/2002 | Ohashi | 333/133 |
| 6,489,861 B1 | 12/2002 | Noguchi et al. | 333/133 |
| 6,531,933 B1 | 3/2003 | Miyamoto et al. | 333/133 |
| 6,731,185 B1 | 5/2004 | Taniguchi | 333/133 |
| 2001/0052830 A1 | 12/2001 | Noguchi et al. | 333/133 |
| 2003/0020562 A1 | 1/2003 | Ikada et al. | 333/133 |

FOREIGN PATENT DOCUMENTS

| | | |
|---|---|---|
| JP | 61-015409 | 1/1986 |
| JP | 5-167388 | 7/1993 |
| JP | 05-259720 | 10/1993 |
| JP | 6-350307 | 12/1994 |
| JP | 8-85089 | 3/1996 |
| JP | 8-191230 | 7/1996 |
| JP | 09-036305 | 2/1997 |
| JP | 09-098046 | 4/1997 |
| JP | 10-270976 | 10/1998 |
| JP | 11-068512 | 3/1999 |
| JP | 11-112264 | 4/1999 |
| JP | 2001-313542 | 11/2001 |
| JP | 2003-115748 | 4/2003 |

* cited by examiner

*Primary Examiner*—Barbara Summons
(74) *Attorney, Agent, or Firm*—Keating & Bennett, LLP

(57) ABSTRACT

A surface acoustic wave duplexer includes a transmission-side surface acoustic wave filter and a receiving-side surface acoustic wave filter which are connected to an antenna terminal, and the transmission-side surface acoustic wave filter and the receiving-side surface acoustic wave filter are mounted on a package material. The surface acoustic wave duplexer further includes a high-frequency wave element which is connected to the transmission-side surface acoustic wave filter and the receiving-side surface acoustic wave filter, and at the same time, has two trap attenuation poles at the higher frequency side than at least the transmission-side pass band and the receiving-side pass band.

19 Claims, 21 Drawing Sheets

SURFACE ACOUSTIC WAVE BRANCHING FILTER

This application is a Continuation-in-Part of U.S. patent application Ser. No. 10/437,239 filed May 14, 2003, now abandoned.

BACKGROUND OF THE INVENTION

1. Field of the Invention

The present invention relates to a surface acoustic wave duplexer used in a wireless communication equipment, for example, a cellular phone, and more specifically, to a surface acoustic wave duplexer which suppresses a high frequency wave which occurs at a side that is higher than a pass band.

2. Description of the Related Art

In cellular phones, a surface acoustic wave duplexer is used to separate a transmission-side signal and a receiving-side signal. Here, the suppression of a twofold wave and a threefold wave of the transmission-side frequency is required.

In Japanese Unexamined Patent Application Publication No. 9-98046 (patent document 1), circuitry in which a low-pass filter is connected in a surface acoustic wave duplexer is disclosed in order to meet these demands. FIG. 20 is a diagram illustrating the circuitry of the surface acoustic wave duplexer described in the patent document 1. In the surface acoustic wave duplexer 201, a transmission-side surface acoustic wave filter 203 and a receiving-side surface acoustic wave filter 204 are connected to a common signal terminal 202 which is connected to an antenna. Also, a first low-pass filter 205 is connected between the common signal terminal 202 and the transmission-side surface acoustic wave filter 203, and a second low-pass filter 206 is connected between the common signal terminal 202 and the receiving-side surface acoustic wave filter 204.

The low-pass filters 205 and 206 have parallel capacitors C1 and C2 and an inductor L which is connected in series.

In addition to a method of using a low-pass filter which is described in patent document 1 described above, a technique is conventionally known in which a trap is formed by using an open stub and a short stub. Thereby, the attenuation of the twofold wave and the attenuation of the threefold wave of the transmission-side frequency are improved.

In Japanese Unexamined Patent Application Publication No. 11-68512 (patent document 2), an example of a method for forming a capacitance element on a piezoelectric substrate of a surface acoustic wave device is disclosed. FIG. 21 is a schematic plan view illustrating the surface acoustic wave device 211. In the surface acoustic wave device 211, surface acoustic wave filters 213 and 214 are disposed on a piezoelectric substrate. Also, a capacitance element 215 for matching impedance is similarly disposed on a piezoelectric substrate 212. The capacitance element 215 is composed of comb-shaped electrodes as shown in FIG. 21, and the direction in which electrode fingers of the comb-shaped electrodes are aligned is turned 90 degrees with respect to the propagation direction of the surface acoustic wave in the surface acoustic wave filters 213 and 214.

Also, in Japanese Unexamined Patent Application Publication No. 5-167388 (patent document 3), in a surface acoustic wave duplexer, an inductance L, which is formed of a metal strip line on a glass epoxy substrate or ceramic substrate, is connected between a surface acoustic wave filter having a relatively high frequency and an antenna-side common terminal. A structure is taught in which the inductance L is a phase-rotation element and operates to increase the impedance of the attenuation band of the low-frequency side of the surface acoustic wave filter of the side to which the inductance L is connected.

In the surface acoustic wave duplexer 201 described in patent document 1, low-pass filters 205 and 206, which are composed of parallel capacitors C1 and C2 and an inductor L connected in series, are connected to both of the transmission-side surface acoustic wave filter 203 and the receiving-side surface acoustic wave filter 204. Thereby, the attenuation of frequency higher than the pass band has been improved. Therefore, not only attenuation of a twofold wave and a threefold wave of the transmission-side frequency, but the attenuation of the high frequency side is improved. However, there has been a problem in that the insertion loss becomes large.

When forming a surface acoustic wave duplexer by a trap-type filter using the above-described open stub, short stub, or other suitable arrangement, by setting the trap positions to a frequency position of the twofold wave and the threefold wave of the transmission-side frequency, the attenuation of the above-described twofold wave and the threefold wave is improved. However, when forming a trap filter using an open stub, or a short stub, the area occupied by the trap filter within the package of the surface acoustic wave duplexer becomes large. Thus, miniaturization of the surface acoustic wave duplexer has been difficult.

In patent document 2, as described above, in a surface acoustic wave filter formed using a piezoelectric substrate, a structure has been disclosed in which a capacitance element is formed by arranging a comb-shaped electrode in a direction in which the alignment direction of electrode fingers is turned 90 degrees with respect to the surface acoustic wave propagation direction of the surface acoustic wave filter. However, the capacitance element 215 is used simply for a matching element of the surface acoustic wave filters 213 and 214.

Also, in patent document 3, the above-described inductor L is simply disclosed as a phase-rotation element in the surface acoustic wave duplexer.

SUMMARY OF THE INVENTION

In order to solve the above described problems, the preferred embodiments of the present invention provide a surface acoustic wave duplexer which has improved attenuation of the twofold wave and the threefold wave of the transmission-side frequency, has little loss, and allows miniaturization.

According to a first preferred embodiment of the present invention, a surface acoustic wave duplexer includes an antenna terminal, a transmission-side surface acoustic wave filter connected to the antenna terminal, a receiving-side surface acoustic wave filter connected to the antenna terminal, a package material on which the transmission-side surface acoustic wave filter and the receiving-side surface acoustic wave filter are mounted, and a high-frequency wave element which is connected to the transmission-side surface acoustic wave filter and the receiving-side surface acoustic wave filter and has two trap attenuation poles at frequencies higher than the transmission-side pass band.

In the first preferred embodiment of the present invention, the two trap attenuation poles are preferably approximately equal to a twofold wave and a threefold wave of the transmission-side pass band.

In the first preferred embodiment of the present invention, the high-frequency wave element may preferably have first and second inductors and first, second, and third capacitance elements, and the two trap attenuation poles may preferably be formed by the first and the second inductors and the first through third capacitance elements.

In the first preferred embodiment of the present invention, the first through third capacitance elements may have a delta-type connection in which two of the capacitance elements are connected to each of first to third common terminals. The first inductor may be connected between the first common terminal and ground potential, and the second inductor may be connected between the second and third common terminals.

In the first preferred embodiment of the present invention, the first trap attenuation pole may be approximately equal to a twofold wave of a pass band of the transmission-side surface acoustic wave filter by an anti-resonance of the second inductor and a capacitance element connected in parallel to the second inductor. The second trap attenuation pole may be approximately equal to a threefold wave of a pass band of the transmission-side surface acoustic wave filter by a resonance of a capacitance which has been obtained in a T-type connection equivalent to the delta-type connection of the first to the third capacitance elements and the first inductor.

According to the second preferred embodiment of the present invention, a surface acoustic wave duplexer includes an antenna terminal, a transmission-side surface acoustic wave filter connected to the antenna terminal, a receiving-side surface acoustic wave filter connected to the antenna terminal, a package material on which the transmission-side surface acoustic wave filter and the receiving-side surface acoustic wave filter are mounted, and a high-frequency wave element which has at least one inductor and at least one capacitance element. One end of the transmission-side surface acoustic wave filter and one end of the receiving-side surface acoustic wave filter are connected at a common connection point. The high-frequency wave element is disposed only between the common connection point and the antenna terminal. The inductor included in the high-frequency wave element is disposed in the package material.

In the second preferred embodiment of the present invention, the surface acoustic wave duplexer may further include a phase-matching strip line disposed in the package material, wherein the inductor included in the high-frequency wave element is formed on the same plane of the package material as the strip line.

In the second preferred embodiment of the present invention, the inductor may be arranged so as to strengthen the magnetic flux over at least two layers in the package material.

In the second preferred embodiment of the present invention, both of the strip line and the inductor may be formed over at least two layers, and the strip line and the inductor are formed on the same at least two layers.

According to the third preferred embodiment of the present invention, a surface acoustic wave duplexer includes an antenna terminal, a transmission-side surface acoustic wave filter which is connected to the antenna terminal and formed using a piezoelectric substrate, a receiving-side surface acoustic wave filter which is connected to the antenna terminal and formed using a piezoelectric substrate, a package material on which the transmission-side surface acoustic wave filter and the receiving-side surface acoustic wave filter are mounted, and a high-frequency wave element which has at least one inductor and at least one capacitance element. The capacitance element includes a comb-shaped electrode disposed on the piezoelectric substrate of the transmission-side and/or the receiving-side surface acoustic wave filter. The direction along an electrode-finger pitch of the comb-shaped electrode is turned substantially 90 degrees with respect to a propagation direction of the surface acoustic wave in the surface acoustic wave filter on which the comb-shaped electrode is formed. The ripple which occurs by the capacitance element is not located at a twofold wave and a threefold wave or in the vicinity thereof of a pass band of the transmission-side surface acoustic wave filter and a pass band of the receiving-side surface acoustic wave filter.

In the third preferred embodiment of the present invention, the piezoelectric substrate may preferably be a $LiTaO_3$ substrate, a pitch of an electrode finger of the comb-shaped electrode constituting the capacitance element may fall in any one of the ranges of the following expressions (1) to (3):

$5500/fH \geq 2 \times P$            Expression (1)

$6800/fL \leq 2 \times P \leq 16500/fH$            Expression (2)

$18800/fL \leq 2 \times P$            Expression (3)

Note that, in the expressions (1) to (3), fH is an upper limit frequency of the pass band of the receiving-side surface acoustic wave filter, fL is a lower limit of the pass band of the filter of the transmission-side surface acoustic wave filter, and P is an electrode-finger pitch of the comb-shaped electrode (a sum of a width of the electrode finger and a space between the electrode fingers).

In the third preferred embodiment of the present invention, the pitch of the electrode finger of the comb-shaped electrode may fall in any one of the ranges of the following expressions (4) to (12):

$5500/fH \geq 2 \times P$            Expression (4)

$6800/fL \leq 2 \times P \leq 16500/fH$            Expression (5)

$18800/fL \leq 2 \times P$            Expression (6)

$5500/(2 \times fTH) \geq 2 \times P$            Expression (7)

$6800/(2 \times fTL) \leq 2 \times P \leq 16500/(2 \times fTH)$            Expression (8)

$18800/(2 \times fTL) \leq 2 \times P$            Expression (9)

$5500/(3 \times fTH) \geq 2 \times P$            Expression (10)

$6800/(3 \times fTL) \leq 2 \times P \leq 16500/(3 \times fTH)$            Expression (11)

$18800/(3 \times fTL) \leq 2 \times P$            Expression (12)

Note that fTL is a lower limit frequency of the pass band of the filter of the transmission-side surface acoustic wave filter, fTH is an upper limit frequency of the pass band of the transmission-side surface acoustic wave filter, and P is an electrode-finger pitch of the comb-shaped electrode.

According to the fourth preferred embodiment of the present invention, a surface acoustic wave duplexer includes an antenna terminal, a transmission-side surface acoustic wave filter which is connected to the antenna terminal and is formed using a piezoelectric substrate, a receiving-side surface acoustic wave filter which is connected to the antenna terminal and is formed using a piezoelectric substrate, a package material on which the transmission-side surface acoustic wave filter and the receiving-side surface acoustic wave filter are mounted, and a high-frequency wave element which has at least one inductor and at least one capacitance element. The capacitance element is formed by forming a laminated structure including a first electrode film, a second electrode film, and an insulation film on a piezoelectric substrate of the transmission-side and/or the receiving-side surface acoustic wave filter.

In the third and fourth preferred embodiments of the present invention, the transmission-side surface acoustic wave filter and the receiving-side surface acoustic wave filter may be formed using individually independent piezoelectric substrates and a capacitance element for forming the high-frequency wave element may be formed on the piezoelectric substrate of the receiving-side surface acoustic wave filter.

In the third and fourth preferred embodiments of the present invention, the capacitance element constituting the high-frequency wave element may be formed in the vicinity of an end of an antenna-terminal side of the receiving-side surface acoustic wave filter.

In the third and fourth preferred embodiments of the present invention, the transmission-side surface acoustic wave filter and the receiving-side surface acoustic wave filter may be formed on the same piezoelectric substrate and a capacitance element for constituting the high-frequency wave element may be formed in the vicinity of an end of an antenna-terminal side of the receiving-side surface acoustic wave filter.

According to the fifth preferred embodiment of the present invention, a surface acoustic wave duplexer includes an antenna terminal, a transmission-side surface acoustic wave filter which is connected to the antenna terminal and is formed using a piezoelectric substrate, a receiving-side surface acoustic wave filter which is connected to the antenna terminal and is formed using a piezoelectric substrate, a package material on which the transmission-side surface acoustic wave filter and the receiving-side surface acoustic wave filter are mounted, and a high-frequency wave element which has at least one inductor and at least one capacitance element. The inductor is disposed in the package material, and the capacitance element is disposed on a piezoelectric substrate of the transmission-side surface acoustic wave filter and/or the receiving-side surface acoustic wave filter.

According to the sixth preferred embodiment of the present invention, a surface acoustic wave duplexer includes an antenna terminal, a transmission-side surface acoustic wave filter which is connected to the antenna terminal and is formed using a piezoelectric substrate, a receiving-side surface acoustic wave filter which is connected to the antenna terminal and is formed using a piezoelectric substrate, a package material on which the transmission-side surface acoustic wave filter and the receiving-side surface acoustic wave filter are mounted, a high-frequency wave element which has at least one inductor and at least one capacitance element, and a phase-adjusting strip line disposed in the package material. The inductor is formed on the same layers in the package material as that of the phase-adjusting strip line. The piezoelectric substrate including the transmission-side surface acoustic wave filter and the receiving-side surface acoustic wave filter is preferably a LiTaO$_3$ substrate. The capacitance element includes a comb-shaped electrode disposed on the piezoelectric substrate. The direction connecting electrode fingers of the comb-shaped electrode is substantially perpendicular to a propagation direction of a surface acoustic wave in the surface acoustic wave filter. The pitch of an electrode finger of the comb-shaped electrode falls in any one of the ranges of the following expressions (13) to (15):

$$5500/fH \geq 2 \times P \qquad \text{Expression (13)}$$

$$6800/fL \leq 2 \times P \leq 16500/fH \qquad \text{Expression (14)}$$

$$18800/fL \leq 2 \times P \qquad \text{Expression (15)}$$

Note that, in the expressions (13) to (15), fH is an upper limit frequency of the pass band of the receiving-side surface acoustic wave filter, fL is a lower limit of the pass band of the filter of the transmission-side surface acoustic wave filter, and P is an electrode-finger pitch of the comb-shaped electrode (a sum of a width of the electrode finger and a space between the electrode fingers).

According to the seventh preferred embodiment of the present invention, a surface acoustic wave duplexer includes an antenna terminal, a transmission-side surface acoustic wave filter connected to the antenna terminal, a receiving-side surface acoustic wave filter connected to the antenna terminal, a package material on which the transmission-side surface acoustic wave filter and the receiving-side surface acoustic wave filter are mounted, at least one phase-matching element, and a low-pass filter. The low-pass filter is connected between the antenna terminal and the transmission-side surface acoustic wave filter and between the antenna terminal the receiving-side surface acoustic wave filter. The low-pass filter has both of a low-pass filter function and an antenna-matching function.

In the seventh preferred embodiment of the present invention, the phase-matching element may be disposed between a surface acoustic wave filter having a relatively high frequency and an antenna terminal, and an amount of phase delay in the phase-matching element may be less than about 90 degrees at a center frequency of a surface acoustic wave filter having the relatively low frequency.

In the surface acoustic wave duplexer according the seventh preferred embodiment of the present invention, the amount of phase delay may fall within a range of about 60 to about 80 degrees.

In the seventh preferred embodiment of the present invention, an impedance at an antenna terminal of the surface acoustic wave duplexer excluding the low-pass filter may be inductive at least in a frequency range of about 50% or more of each pass band width of a transmission-side surface acoustic wave filter and a receiving-side surface acoustic wave filter. An impedance in a pass band of the low-pass filter may be capacitive. Matching may be obtained on a real axis when viewed from an antenna side.

According to the eighth preferred embodiment of the present invention, a surface acoustic wave duplexer includes an antenna terminal, a transmission-side surface acoustic wave filter connected to the antenna terminal, a receiving-side surface acoustic wave filter connected to the antenna terminal, a package material on which the transmission-side surface acoustic wave filter and the receiving-side surface acoustic wave filter are mounted, and a high-frequency wave element which includes at least one inductor and at least one capacitance element. One end of the transmission-side surface acoustic wave filter and one end of the receiving-side surface acoustic wave filter are connected at a common connection point. The high-frequency wave element is disposed only between the common connection point and the antenna terminal. The inductor is disposed in the package material. The capacitance element includes a comb-shaped electrode disposed on the piezoelectric substrate. The direction of an electrode-finger pitch of the comb-shaped electrode is turned substantially 90 degrees with respect to a propagation direction of the surface acoustic wave propagated on the piezoelectric substrate. The ripple caused by the capacitance element is not located at a twofold wave and a threefold wave or in the vicinity thereof of a pass band of the transmission-side surface acoustic wave filter and a pass band of the receiving-side surface acoustic wave filter. The high-frequency wave element has both of a low-pass filter function and an antenna-matching function.

According to the ninth preferred embodiment of the present invention, a surface acoustic wave duplexer includes an antenna terminal, a transmission-side surface acoustic wave filter connected to the antenna terminal, a receiving-side surface acoustic wave filter connected to the antenna terminal, a package material on which the transmission-side surface acoustic wave filter and the receiving-side surface acoustic wave filter are mounted, a phase-adjusting strip line disposed in the package material, and a high-frequency wave element. The high-frequency wave element has two trap attenuation poles approximately equal to a twofold wave and a threefold wave. The high-frequency wave element includes at least first and second inductors and a first through third capacitance elements. The first through third capacitance elements are connected in a delta-type connection in which two of the capacitance elements are connected to each of a first through third common terminals. The first inductor is connected between the first common terminal and ground potential, and the second inductor is connected between the second and third common terminals. The second inductor is formed on the same layers as that of the phase-adjusting strip line disposed in the package material. The terminal which is connected to the transmission-side signal terminal of the strip line and a terminal which is connected to the transmission-side signal terminal of the second inductor are short-circuited in the package material.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Figure 1:
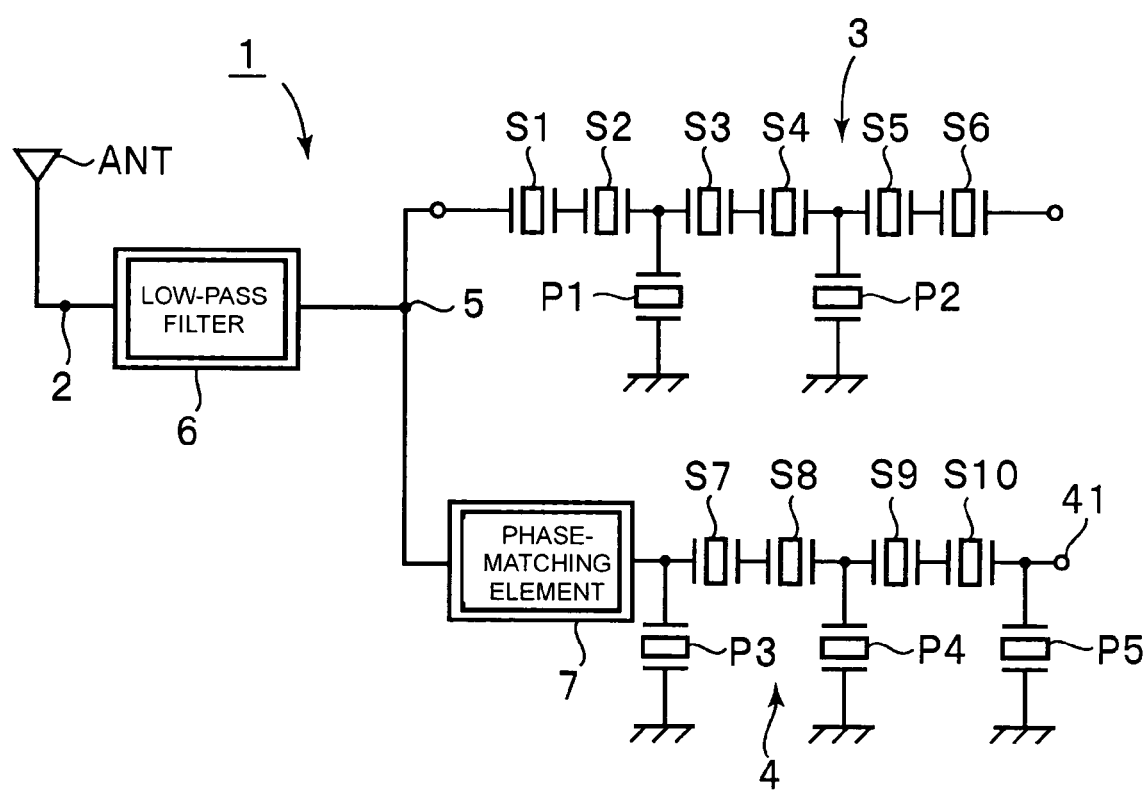
FIG. 1 is a diagram illustrating the circuitry of the surface acoustic wave duplexer according to a first preferred embodiment of the present invention.
Figure 2:
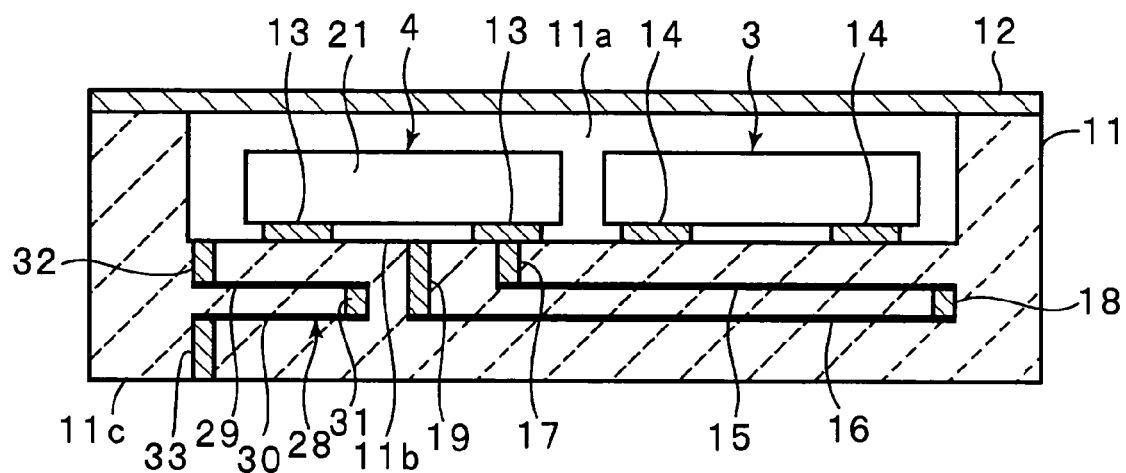
FIG. 2 is a schematic sectional front view of the surface acoustic wave duplexer of the first preferred embodiment of the present invention.

FIG. 1 is a diagram illustrating the circuitry of the surface acoustic wave duplexer according to a preferred embodiment of the present invention, and FIG. 2 is a sectional front view of the surface acoustic wave duplexer.

The surface acoustic wave duplexer 1 of the first preferred embodiment is a surface acoustic wave duplexer for use in a communication device, for example, a cellular phone, which preferably has a transmission-side pass band of 824–849 MHz and preferably has a receiving-side pass band of 869–894 MHz. However, the transmission-side pass band and the receiving-side pass band in the surface acoustic wave duplexer according to the first preferred embodiment of the present invention are not limited to these values and may be any other suitable value.

As shown in FIG. 1, the surface acoustic wave duplexer 1 has an antenna terminal 2 connected to an antenna ANT, and a transmission-side surface acoustic wave filter 3 and a receiving-side surface acoustic wave filter 4 connected to the antenna terminal 2.

The transmission-side surface acoustic wave filter 3 and the receiving-side surface acoustic wave filter 4 have individual antenna terminal side ends which are connected at a common connection point 5. Also, a low-pass filter 6 as a high-frequency wave element is connected between the antenna terminal 2 and the common connection point 5. Details of the low-pass filter 6 will be described below.

Also, a phase-matching element 7 is connected between the receiving-side surface acoustic wave filter 4 and the common connection point 5.

As shown in FIG. 2, the package structure of the surface acoustic wave duplexer 1 of the present preferred embodiment includes a package material 11 and a lid material 12. The package material 11 has an opening 11a which opens upwards, and a lid material 12 is joined to the package material 11 so as to close the opening 11a. The package material 11 includes, for example, a piezoelectric ceramic, a synthetic resin, or other suitable material. Also, the lid material 12 preferably includes a material such as a metal or a ceramic.

In the opening 11a of the package material 11, the transmission-side surface acoustic wave filter 3 and the receiving-side surface acoustic wave filter 4 are mounted on a chip-mounting surface 11b of the package material 11 by a flip-chip bonding construction method using bumps 13 and 14. In this regard, the chip-mounting face 11b is the bottom surface of the opening 11a. However, in the case of using a flat-plate package substrate, the chip-mounting surface is a top surface.

Also, an antenna terminal 2 (refer to FIG. 1) is disposed on the side of the package material 11 where the receiving-side surface acoustic wave filter 4 is disposed.

Each of the transmission-side surface acoustic wave filter 3 and the receiving-side surface acoustic wave filter 4 includes a plurality of one-port type surface acoustic wave resonator on an independent piezoelectric substrate. Also, as is apparent from FIG. 1, the transmission-side surface acoustic wave filter 3 has a ladder-type circuitry including a plurality of series-arm resonators S1 to S6 and a plurality of parallel-arm resonators P1 and P2. Similarly, the receiving-side surface acoustic wave filter 4 also has a ladder-type circuitry including a plurality of series-arm resonators S7 to S10 and a plurality of parallel-arm resonators P3 to P5.

The series-arm resonators S1 to S6 and S7 to S10, and parallel-arm resonators P1, P2, and P3 to P5 are preferably individually composed of one-port type surface acoustic wave resonators.

Figure 3:
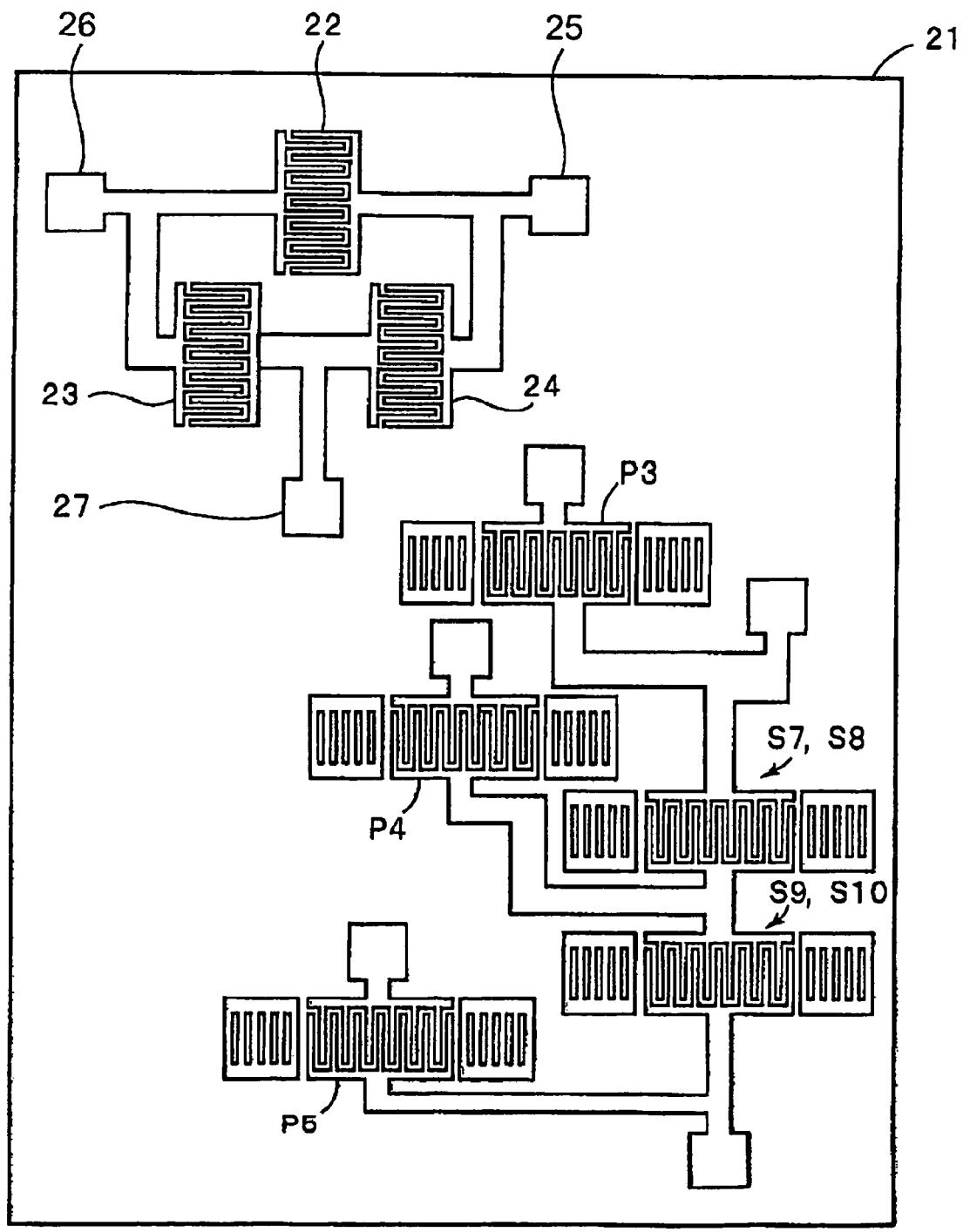
FIG. 3 is a schematic sectional plan view for illustrating a receiving-side surface acoustic wave filter to be used in the first preferred embodiment of the present invention and the first through third capacitance elements formed in the piezoelectric substrate of the receiving-side surface acoustic wave filter.

As shown in FIG. 3, the receiving-side surface acoustic wave filter 4 includes a substantially rectangular piezoelectric substrate 21. The series-arm resonators S7 to S10 and parallel-arm resonators P3 to P5 are formed on the piezoelectric substrate 21. In this regard, the series-arm resonators S7 and S8 are shown as one resonator in FIG. 3. Similarly, the series-arm resonators S9 and S10 are also shown as one resonator in FIG. 3. Each of the series-arm resonators S7 to S10 and parallel-arm resonators P3 to P5 are preferably composed of one-port type surface acoustic wave resonator in which a grating reflector is provided on both sides of the surface acoustic wave propagation direction of an IDT (interdigital transducer) made of comb-shaped electrodes.

Similarly, the transmission-side surface acoustic wave filter 3 has a structure in which a plurality of one-port type surface acoustic wave resonators are arranged such that the series-arm resonators S1 to S6 and the parallel-arm resonators P1 and P2 are disposed on a substantially rectangular piezoelectric substrate.

In the first preferred embodiment, a 36-degree LiTaO$_3$ substrate is preferably used as a piezoelectric substrate for forming the transmission-side surface acoustic wave filter 3 and the receiving-side surface acoustic wave filter 4. However, a piezoelectric substrate for forming the surface acoustic wave filters 3 and 4 may be composed of another piezoelectric monocrystal or piezoelectric ceramic or other suitable material. Also, in the first preferred embodiment, an Al alloy having Al as a main component is preferably used as a material for various electrodes formed on the piezoelectric substrate. However, a material other than Al, for example, Au, Cu, or suitable material may be used. Also, various electrodes may be formed by laminating a plurality of metals.

Referring back to FIG. 1, the phase-matching element 7 is connected between the receiving-side surface acoustic wave filter 4 and the common connection point 5. More specifically, the phase-matching element 7 includes strip lines embedded in the package material 11. Specifically, as shown in FIG. 2, strip lines 15 and 16 are disposed at a height between the chip-mounting surface 11b and a bottom surface 11c of the package material 11. One end of the strip line 15 is connected to the receiving-side surface acoustic wave filter 4 by a via hole electrode 17. The other end of the strip line 15 is connected to the strip line 16 by a via hole electrode 18. The strip line 16 is connected to a wiring electrode (not shown in the figure) formed on the chip-mounting surface 11b of the package material 11 by a via hole electrode 19. The wiring electrode is connected to the common connection point 5 in FIG. 1.

Specifically, the phase-matching element 7 is formed in the package material 11 of the surface acoustic wave duplexer 1. The strip lines 15 and 16 preferably have a characteristic impedance of nearly 50 Ω. Also, the length of the strip lines 15 and 16 is such that the phase-shift amount is about 75 degrees at a central frequency, which is preferably about 836.5 MHz, of the pass band of the transmission-side surface acoustic wave filter 3.

The low-pass filter 6 in FIG. 1 has at least one capacitance element and at least one inductor. More specifically, as shown in FIG. 3, first to third capacitance elements 22 to 24 are formed on the piezoelectric substrate 21 of the receiving-side surface acoustic wave filter 4.

The first to third capacitance elements 22 to 24 all preferably include a comb-shaped electrode. Also, the first to the third capacitance elements 22 to 24 have a delta-type connection in which two of the capacitance elements are connected to each of the first to the third common terminals 25 to 27.

The low-pass filter 6 is constructed to use the resonance of the capacitance obtained by the delta-type connection of the first to the third capacitance elements 22 to 24 and inductance elements 29 and 30 which are embedded in the package material 11 shown in FIG. 2. Specifically, the inductance elements 29 and 30 are formed by forming electrodes in a plurality of layers in the package material 11 so as to define the inductor 28. The inductance elements 29 and 30 may be formed having a shape such as a spiral shape, a meandering shape, or suitable shape, depending on the inductance value. The inductance elements 29 and 30 are connected through a via hole electrode 31. One end of the inductance element 29 is connected to a wiring electrode (not shown in the figure) disposed on the upper surface of the package material 11 through a via hole electrode 32. Also, the inductance element 30 is connected to a via hole electrode 33, and the via hole electrode 33 extends to a bottom surface and is connected to a wiring electrode (not shown in the figure) disposed on the bottom surface 11c of the package material 11. In the same manner as the inductance elements 29 and 30, an additional pair of inductance elements is formed (not shown in the figure).

Figure 4:
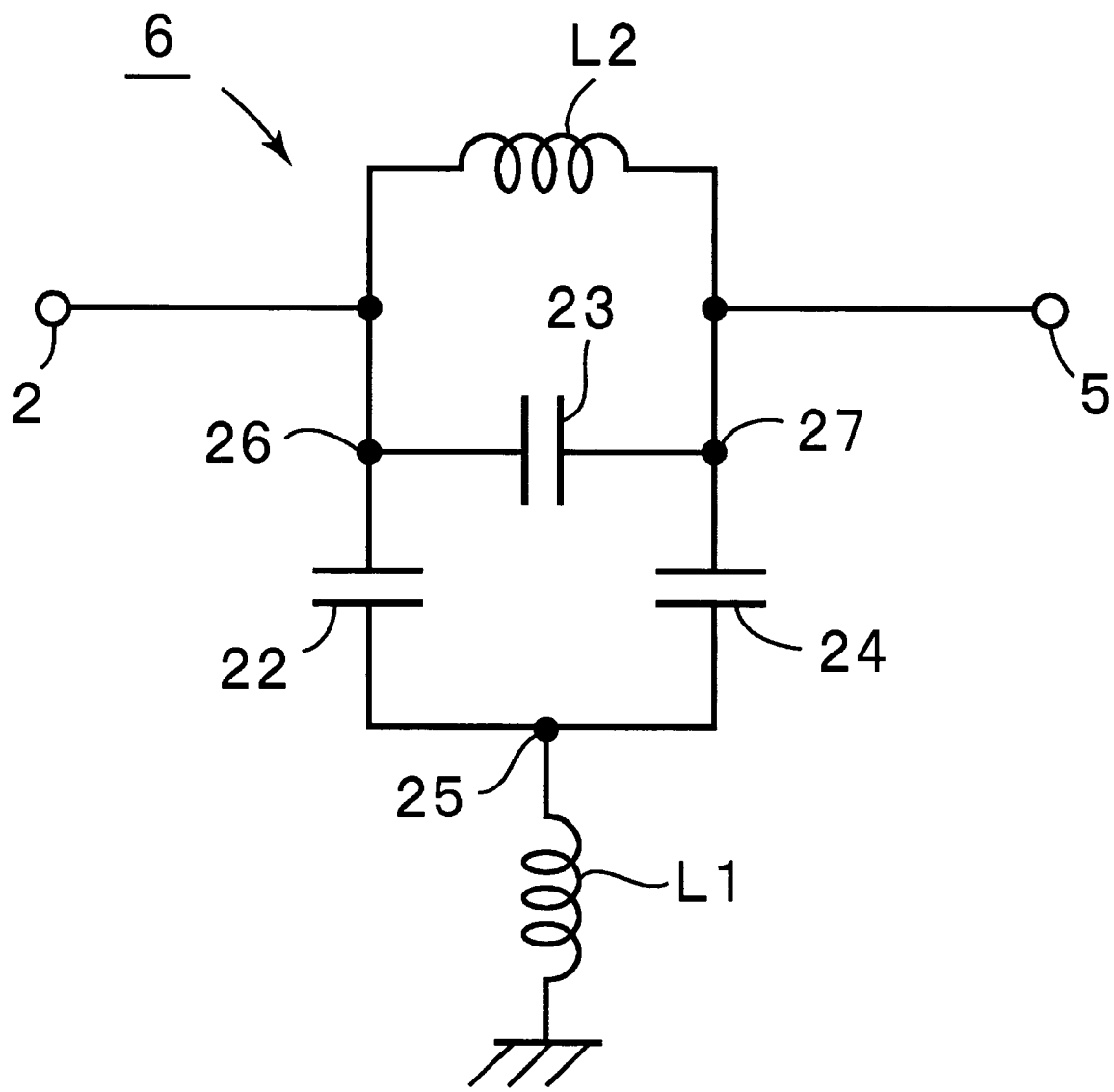
FIG. 4 is a diagram illustrating the circuitry of the high-frequency wave element used in the surface acoustic wave duplexer of the first preferred embodiment of the present invention.

The low-pass filter 6 having a circuitry shown in FIG. 4 includes the inductance elements 29 and 30, the additional pair of inductance elements, and the first to the third capacitance elements 22 to 24. In this regard, inductances L1 and L2 in FIG. 4 include the inductance elements 29 and 30, and the additional pair of inductance elements. Specifically, the inductance elements 29 and 30 are connected to the capacitance elements 22 to 24 so as to form the circuit shown in FIG. 4. In this regard, because the inductance L1 has a smaller inductance value as compared with L2, the filter may be composed of only a via hole having a one-layer structure.

As described above, the low-pass filter 6 is connected between the antenna terminal 2 and the common connection point 5. The low-pass filter 6 has a frequency characteristic having an attenuation pole at the twofold wave and the threefold wave, or in the vicinity thereof, of the central frequency of the pass band of the transmission-side surface acoustic wave filter, and operates to match impedance in the pass band of the transmission-side and the receiving-side surface acoustic wave filter. Specifically, in the present preferred embodiment, by the low-pass filter 6, a first attenuation pole occurs at the twofold wave and in the vicinity thereof of the pass band of the transmission-side surface acoustic wave filter 3, and a second attenuation pole occurs at the threefold wave or in the vicinity thereof. Therefore, the twofold wave and the threefold wave of the pass band of the transmission-side surface acoustic wave filter can be effectively suppressed, and a favorable frequency characteristic is obtained.

As shown in FIG. 3, the alignment direction of the electrode fingers of the comb-shaped electrode forming the capacitance elements 22 to 24 (that is, the direction of the electrode finger pitch) is arranged in a direction that is substantially perpendicular to the propagation direction of the surface acoustic wave in the receiving-side surface acoustic wave filter 4. In this regard, the propagation direction of the surface acoustic wave in the receiving-side surface acoustic wave filter is the propagation direction of the surface acoustic wave in the series-arm resonators S7 to S10 and the parallel-arm resonators P3 to P5. In other words, the direction of the electrode finger pitch of each of the comb-shaped electrodes of the capacitance elements 22 to 24 is a direction which is turned substantially 90 degrees with respect to the propagation direction of the surface acoustic wave.

Also, the electrode finger pitch in the capacitance elements 22 to 24 (that is, a sum of the width of the electrode finger and a space between the electrode fingers) is preferably about 4.5 μm in the present preferred embodiment.

As shown in FIG. 2, the inductance elements 29 and 30 are formed over a plurality of layers in the same manner as the strip lines 15 and 16 of the phase-matching element, and the inductance elements 29 and 30 and the strip lines 15 and 16 are formed on the same layers. Specifically, in the present preferred embodiment, the electrodes of the inductance element and the electrodes of the phase-matching element 7 are disposed over a plurality of layers, and are located on the same plane. In this regard, the above-described additional pair of inductance, which is not shown, is formed in the same manner as the inductance 29 and 30.

Next, a description will be given of the operations and effects of the surface acoustic wave duplexer 1.

Figure 5:
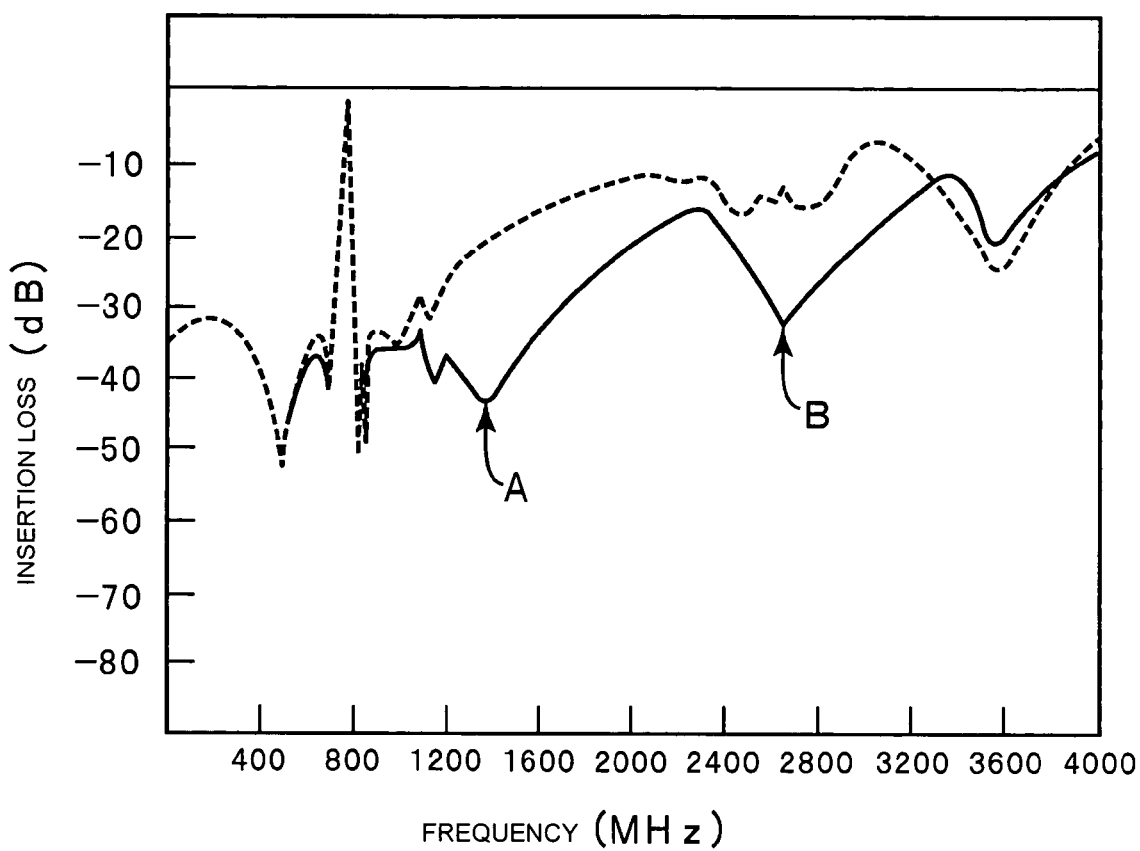
FIG. 5 is a diagram illustrating the frequency characteristic of the surface acoustic wave duplexer of the first preferred embodiment of the present invention and the frequency characteristic of the surface acoustic wave duplexer of a comparative example having no high-frequency wave element.

The surface acoustic wave duplexer of the present preferred embodiment and a surface acoustic wave duplexer of a comparative example from which the low-pass filter 6 has been removed have been prepared, and their frequency characteristics have been measured. FIG. 5 shows the result. The solid line in FIG. 5 indicates the frequency characteristic of the surface acoustic wave duplexer 1, and the broken line indicates the frequency characteristic of the surface acoustic wave duplexer of the comparative example.

As is seen from FIG. 5, in the surface acoustic wave duplexer 1 of the present preferred embodiment, first and second attenuation poles, which are indicated by arrows A and B, occur at frequency positions of the twofold wave and the threefold wave of the central frequency of the receiving-side surface acoustic wave filter 4. Specifically, because of the low-pass filter 6, the attenuation of the twofold wave and the threefold wave of the pass band of the transmission-side surface acoustic wave filter 3 is improved.

In the first preferred embodiment, the low-pass filter 6 includes the circuitry shown in FIG. 4. However, in the present invention, the circuitry of the low-pass filter 6 may have many variations.

Figure 7:
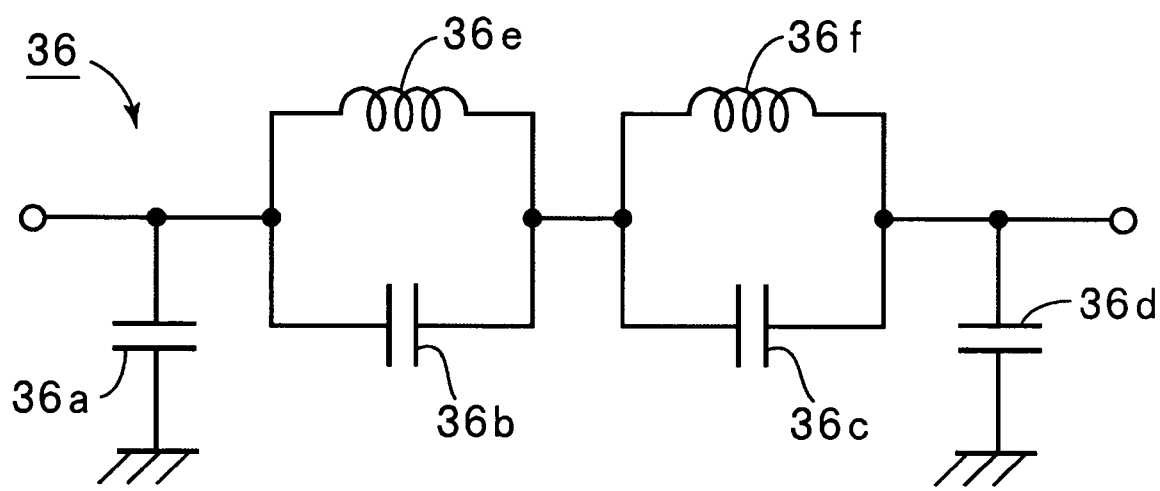
FIG. 7 is a diagram illustrating the circuitry of a variation of the high-frequency wave element.
Figure 9:
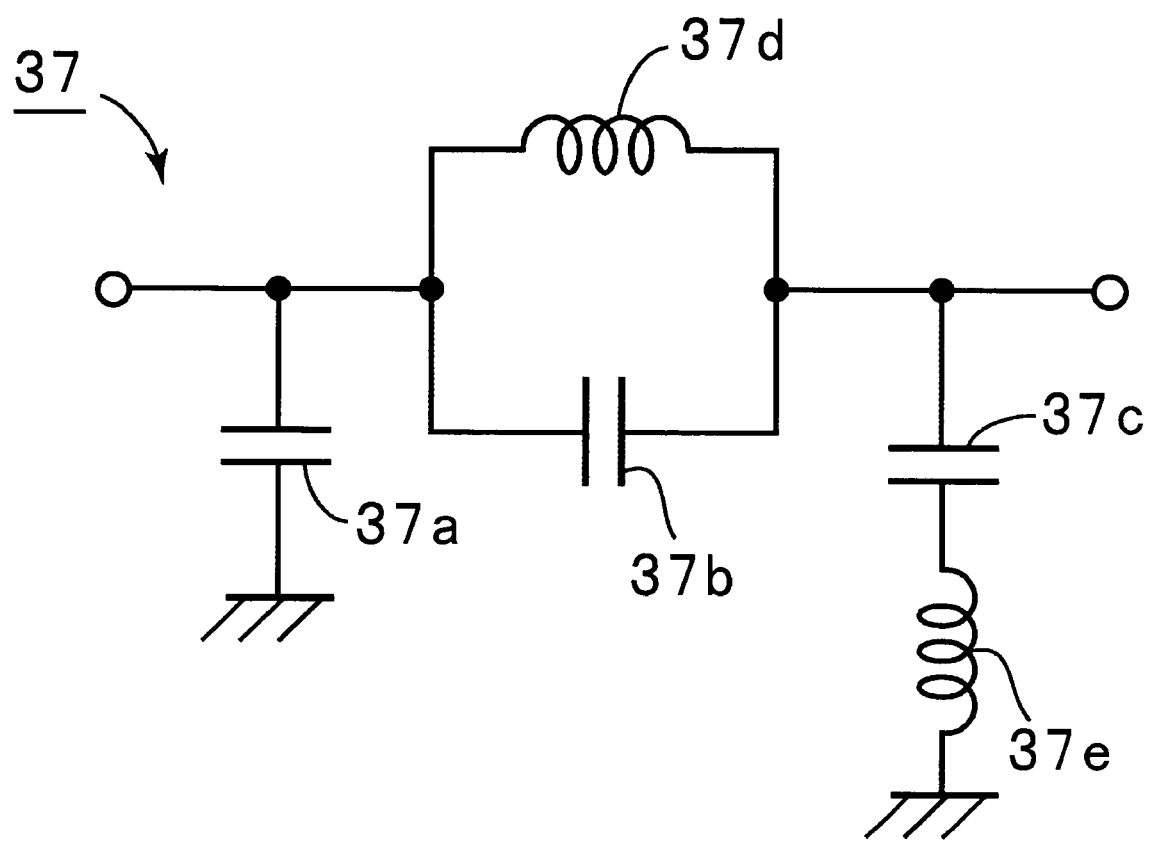
FIG. 9 is a circuit diagram illustrating still another variation of the high-frequency wave element.

FIGS. 7 and 9 are individual circuit diagrams illustrating variations of the low-pass filter 6.

A low-pass filter 36 shown in FIG. 7 preferably includes four capacitance elements 36a to 36d and two inductance elements 36e and 36f. Specifically, the inductance element 36e and the capacitance element 36b are connected in parallel, and similarly, the inductance element 36f and the capacitance element 36c are connected in parallel. The parallel-connected structure of the inductance element 36e and the capacitance element 36b is connected in series to the parallel-connected structure of the inductance element 36f and the capacitance element 36c. Capacitance elements 36a and 36d are individually connected between the outside of the parallel-connected structures and ground potential.

Also, a low-pass filter 37 shown in FIG. 9 preferably includes three capacitance elements 37a to 37c and two inductance elements 37d and 37e. Here, the inductance element 37d and the capacitance element 37b are connected in parallel. The capacitance elements 37a and 37c are connected between the outside of this parallel-connection structure and ground potential. Also, the inductance element 37e is connected between the capacitance elements 37c and ground potential.

Figure 6:
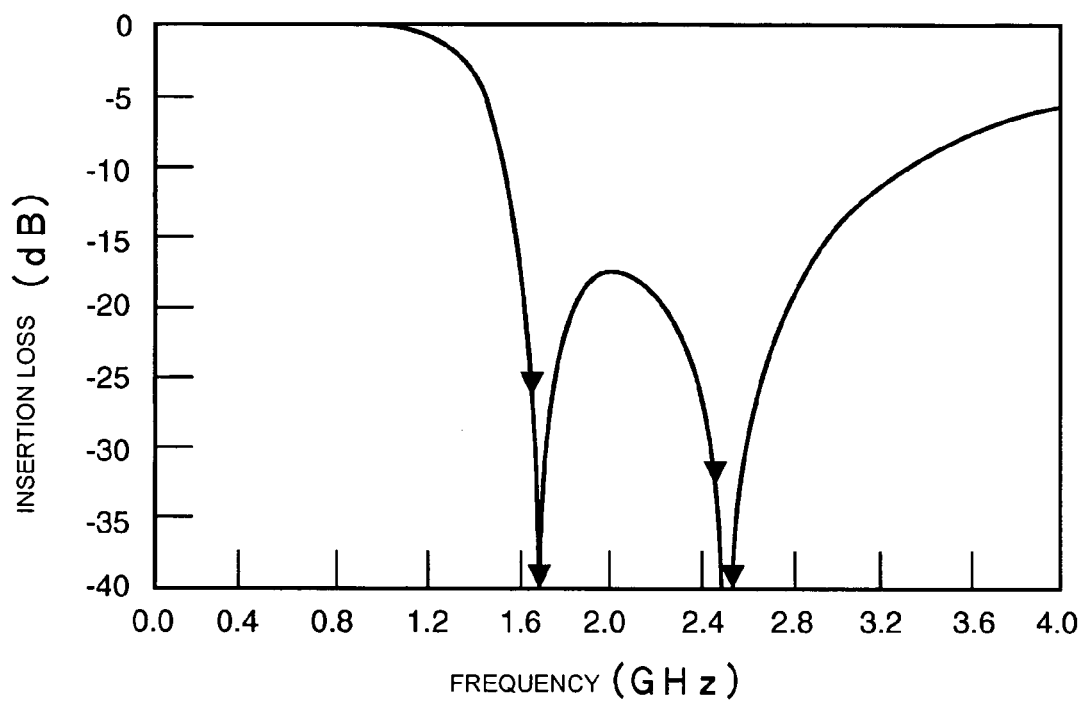
FIG. 6 is a diagram illustrating the frequency characteristic of the high-frequency wave element shown in FIG. 4.
Figure 8:
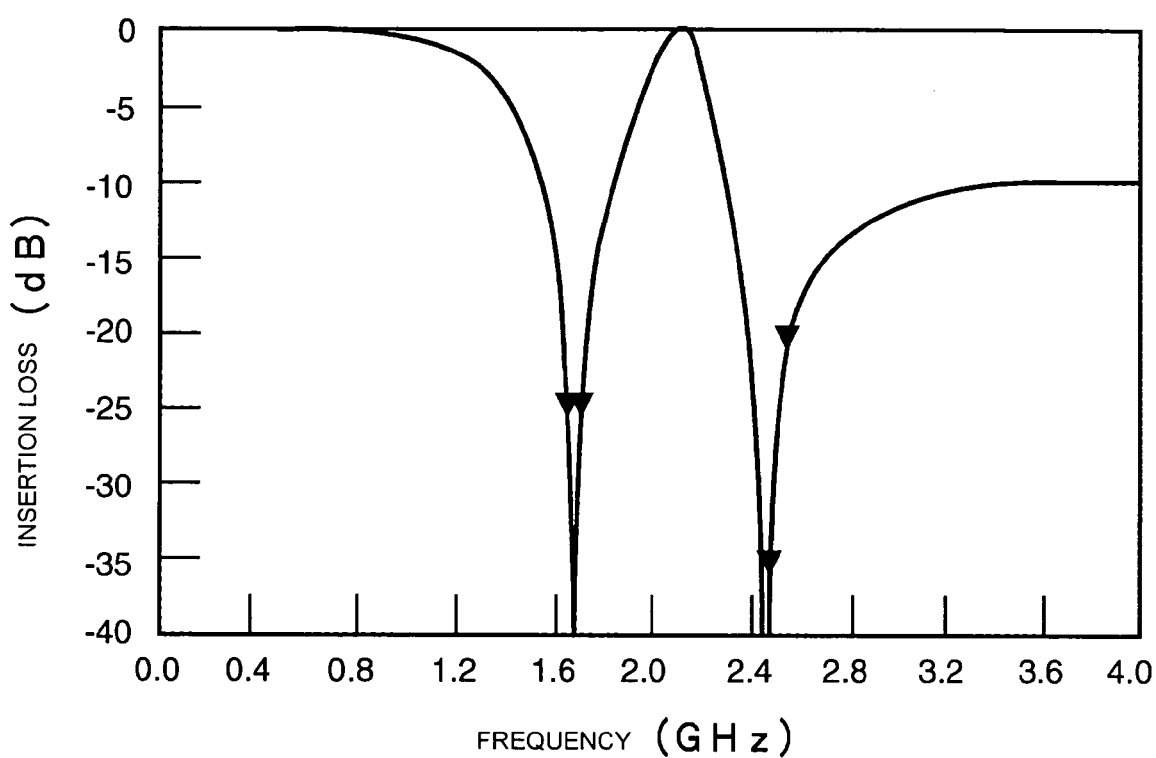
FIG. 8 is a diagram illustrating the frequency characteristic of the high-frequency wave element of the variation shown in FIG. 7.
Figure 10:
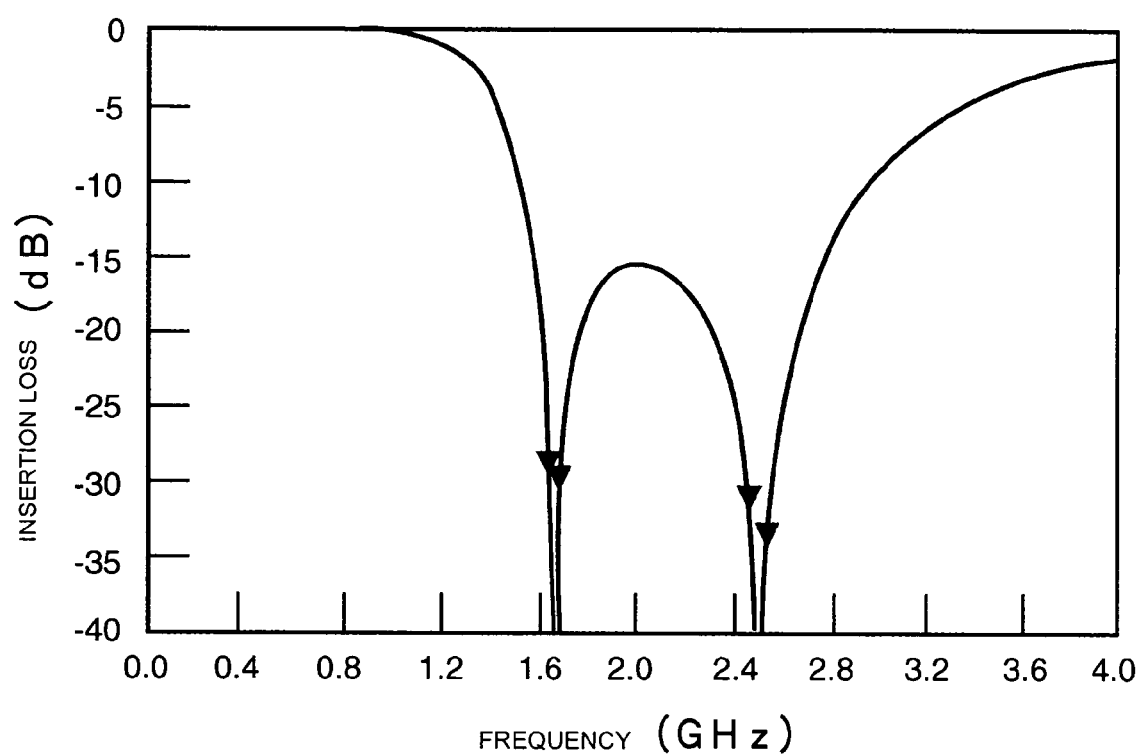
FIG. 10 is a diagram illustrating the frequency characteristic of the high-frequency wave element shown in FIG. 9.

FIGS. 6, 8, and 10 are diagrams illustrating the frequency characteristics of the low-pass filters 6, 36, and 37.

In this regard, the frequency characteristics of the low-pass filters 6, 36, and 37 shown in FIGS. 6, 8, and 10 are the frequency characteristics when the inductance elements and the capacitance elements in the low-pass filters are as shown in Table 1.

TABLE 1

| | Parameters | | |
|---|---|---|---|
| | First Circuit | Second Circuit | Third Circuit |
| L1 | 1.05 nH | Inductance Element 36e 3.5 nH | Inductance Element 37d 4.2 nH |

TABLE 1-continued

| Parameters | | | | | |
|---|---|---|---|---|---|
| First Circuit | | Second Circuit | | Third Circuit | |
| L2 | 4.2 nH | Inductance Element 36f | 4.2 nH | Inductance Element 37e | 1.6 nH |
| Capacitance Element 22 | 1.3 pF | Capacitance Element 36a | 1 pF | Capacitance Element 37a | 1 pF |
| Capacitance Element 23 | 2.35 pF | Capacitance Element 36b | 1.2 pF | Capacitance Element 37b | 2.35 pF |
| Capacitance Element 24 | 1.3 pF | Capacitance Element 36c | 3.5 pF | Capacitance Element 37c | 2.5 pF |
|  |  | Capacitance Element 36d | 1 pF |  |  |

As is apparent from FIGS. 8 and 10, when using the low-pass filters 36 and 37, as in the case of the low-pass filters 6, a first and second attenuation also occur at the twofold wave and the threefold wave of the pass band of the transmission-side surface acoustic wave filter 3.

However, in the low-pass filters 36 and 37, the attenuation in the band of the attenuation poles becomes low compared with the attenuation in the band of the attenuation poles of the low-pass filter 6. Therefore, in order to suppress the loss at the pass band at the minimum, it is desirable to use the above-described low-pass filter 6.

As described above, by using the low-pass filter 6 shown in FIG. 4 (that is, by combining at least three capacitance elements and at least two inductance elements), matching is obtained in the vicinity of the pass band, which is about 800 MHz to about 900 MHz, of the transmission-side surface acoustic wave filter, and thus the filter characteristic having attenuation poles at the twofold wave and the threefold wave thereof is obtained.

In particular, in the low-pass filter 6, the first through third capacitance elements 22 to 24 have a delta-type connection as described above, the first inductance element L1 is connected between the first common terminal 25 and ground potential, and the second inductance element L2 is connected between the second and the third common terminals 26 and 27. Here, the first attenuation pole occurs by the anti-resonance of the second inductance L2 and the capacitance element 23 which is connected in parallel with the second inductance L2, and the second attenuation pole occurs by the resonance of a capacitance $C_Z$ described below and the first inductance element L1. Accordingly, when using the low-pass filter 6, as compared with the low-pass filters 36 and 37, not only is the number of elements reduced, but also the capacitance value and the inductance value are small. Also, the low-pass filter 6 is easier to miniaturize compared to the low-pass filters 36 and 37.

Figure 11A:
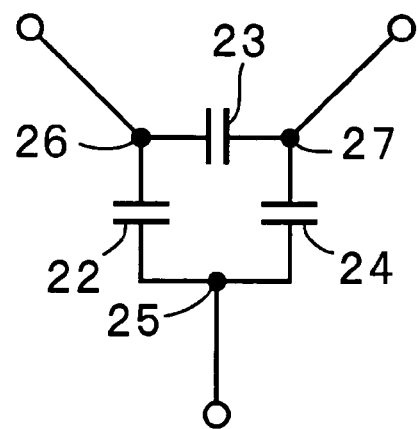
FIG. 11(a) and FIG. 11(b) are a circuit diagram illustrating a first through third capacitive elements having a delta-type connection and a circuit diagram illustrating a circuit when the delta-type connection is replaced by a T-type circuit.
Figure 11B:
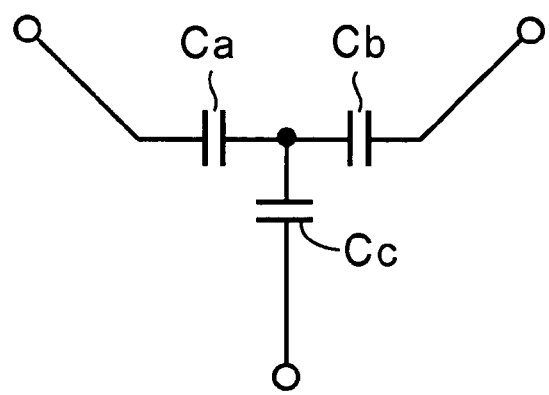

The position of the attenuation pole of the low-pass filter 6 can be calculated by transforming the connection of the first through third capacitance elements 22 to 24 of the low-pass filter 6, for example, from the delta-connection shown in FIG. 11(a) to the T-type connection structure shown in FIG. 11(b). In the T-type connection structure, the value of the total capacitance CZ is as follows.

$$C_Z = (Ca + Cb + Ca \times Cc/Cb)$$

Substituting Ca=1.3 pF, Cb=1.3 pF, and Cc=2.35 pF in accordance with Table 1 yields $C_Z$=3.3 pF, which is a large value.

Also, the position of the second attenuation pole is determined by the resonance of the inductance element L1 and the capacitance $C_Z$. Accordingly, because the position of the second attenuation pole is determined by $1/(2 \times \pi \times (L1 \times C_Z)^{1/2})$ when the value of the capacitance $C_Z$ becomes large, the frequency can be matched even if the value of the L1 is small. Thus, miniaturization is easily achieved compared with the low-pass filters 36 and 37.

In this regard, the inductance element forming the low-pass filter may be disposed outside of the receiving-side surface acoustic wave filter 4. However, as in the above-described preferred embodiment, by including the inductance elements 29 and 30 in the package material 11, further miniaturization can be achieved. Also, the added value of the surface acoustic wave duplexer 1 can be increased.

In the present preferred embodiment, the low-pass filter 6 needs to be formed such that the twofold wave and the threefold wave of the pass band of the transmission-side surface acoustic wave filter 3 are attenuated. In the present preferred embodiment, the low-pass filter 6 is connected between the receiving-side surface acoustic wave filter 4 and the antenna terminal 2. On the other hand, when the low-pass filter 6 is connected between the receiving-side surface acoustic wave filter 4 and the output terminal 41 (refer to FIG. 1), the frequency characteristic of the receiving-side surface acoustic wave filter 4 can also be improved. However, as in the above-described preferred embodiment, the low-pass filter 6 is preferably connected to the antenna side of the receiving-side surface acoustic wave filter 4, and, thereby, the high frequency characteristic of the receiving-side surface acoustic wave filter is improved.

Also, the inductance elements 29, 30, and other elements are preferably formed in the package material 11. However, if the inductance elements 29, 30, and other elements are disposed at the transmission-side surface acoustic wave filter 3, a capacitive coupling and an inductive coupling can occur between the phase-matching strip lines 15 and 16, and thus the characteristic of the attenuation band can be extremely deteriorated. On the other hand, as in the case of the present preferred embodiment, when the inductance elements 29, 30, and other elements are spaced apart from each other in a direction of the main surface of the package material 11 and located on the side of the receiving-side surface acoustic wave filter 4, the above-described coupling is made very difficult. Thus, the deterioration of the characteristic of the attenuation band can be effectively prevented. Furthermore, the inductance elements 29, 30, and other elements can be disposed over a plurality of layers and on the same plane with the strip lines 15 and 16. Thus, the miniaturization of the package material 11 and the simplification of the manufacturing process are achieved.

In addition, in a structure in which the inductance elements 29 and 30 are disposed on the same surface with the strip lines 15 and 16, respectively, the manufacturing process can be simplified, as described above. Thus, the cost reduction and the decreasing of the height of the surface acoustic wave duplexer 1 are achieved. In particular, because the inductance elements 29 and 30, and other elements, are formed over a plurality of layers, the inductance elements 29 and 30, and other elements, increase self-induction with each other. Thus miniaturization is promoted.

In addition, the phase-matching strip lines 15 and 16 are similarly formed over a plurality of layers and are formed on the same plane with the above-described inductance elements 29 and 30. Thus, they are simultaneously formed by the same process and the cost can be reduced.

In this regard, the capacitance of the low-pass filter may be included in the package material 11. However, by forming a capacitance element on the piezoelectric substrate 21 of the surface acoustic wave filter 4 as the above-described preferred embodiment, the shortening the height of the surface acoustic wave duplexer 1 is achieved as compared with the case of including the capacitance in the package material 11. In particular, when using the capacitance elements 22 to 24 including comb-shaped electrodes as described above, a large capacitance can be obtained in a small area, and thus the capacitance element can be miniaturized. Also, because the capacitance elements 22 to 24 are formed using the above-described comb-shaped electrode, the capacitance element can be formed at the same time the electrodes of the surface acoustic wave resonator are formed. Thus, the cost can be reduced in addition.

In the above-described preferred embodiment, the direction of the electrode finger pitch of the comb-shaped electrode of the capacitance elements 22 to 24 is arranged in a direction substantially perpendicular to the propagation direction of the surface acoustic wave, and thus, unnecessary response is difficult to occur in the comb-shaped electrode of the capacitance elements 22 to 24.

Preferably, when using a $LiTaO_3$ substrate as a piezoelectric substrate, the range of the electrode-finger pitch P of the comb-shaped electrodes of the capacitance elements 22 to 24 are desired to fall within the range of the following expressions (1) to (3). With this arrangement, the surface acoustic wave duplexer 1 having a further lower-loss is provided.

In this regard, fH is an upper limit frequency of the pass band of the receiving-side surface acoustic wave filter, and fL is a lower limit of the pass band of the filter of the transmission-side surface acoustic wave filter.

$$5500/fH \geq 2 \times P \quad \text{Expression (1)}$$

$$6800/fL \leq 2 \times P \leq 16500/fH \quad \text{Expression (2)}$$

$$18800/fL \leq 2 \times P \quad \text{Expression (3)}$$

In the above-described preferred embodiment, fH=894 MHz, and fL=824 MHz, and thus the comb-shaped electrode may be constructed to meet any one of the following relationships:

$$6.15 \times 10^{-6} \geq 2 \times P$$

$$8.25 \times 10^{-6} \leq 2 \times P \leq 18.5 \times 10^{-6}$$

$$22.8 \times 10^{-6} \leq 2 \times P$$

In the preferred embodiment described above, the electrode finger pitch P of the comb-shaped electrode is preferably about 4.5 μm, and thus the above-described conditions are met. Accordingly a favorable filter characteristic is obtained.

Figure 12:
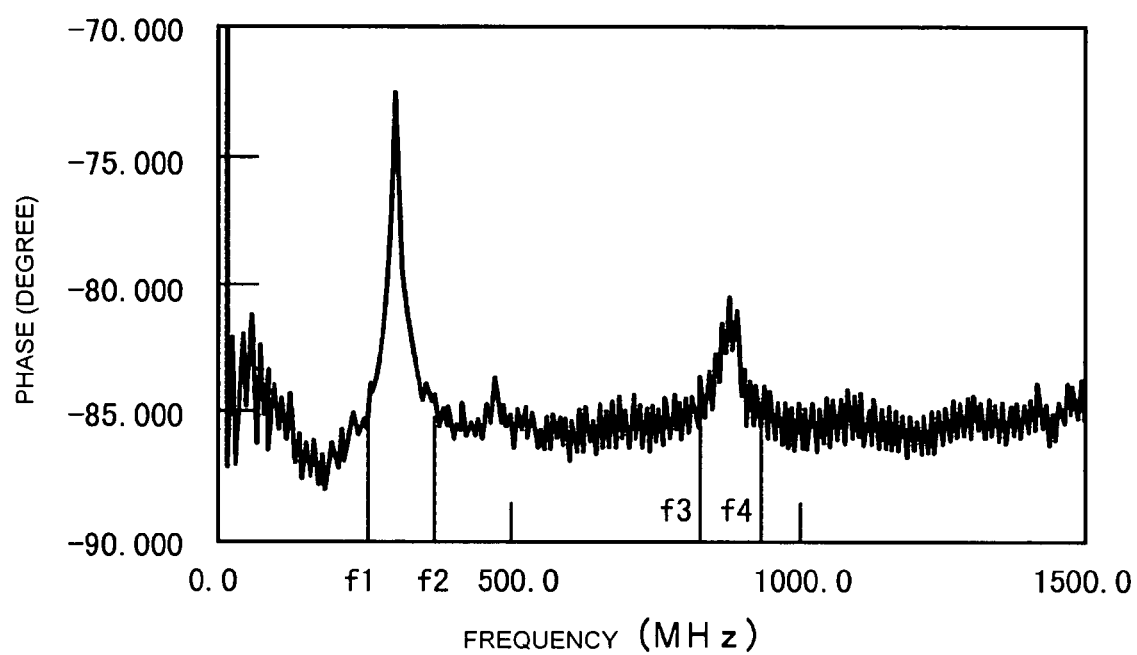
FIG. 12 is a diagram illustrating a phase-frequency characteristic of the structure in which a surface acoustic wave filter and a comb-shaped electrode are formed on a 36-degree $LiTaO_3$ substrate such that the electrode-finger pitch direction is a direction which is turned substantially 90 degrees with respect to the propagation direction of the surface acoustic wave.

Next, a description will be given of the expressions (1) to (3) with reference to FIG. 12.

A comb-shaped electrode was formed on a 36-degree $LiTaO_3$ substrate on which a surface acoustic wave filter is formed such that the electrode fingers are aligned in a direction which is turned substantially 90 degrees with respect to the propagation direction of the surface acoustic wave in the surface acoustic wave filter. The impedance of the comb-shaped electrode was measured. The result is shown in FIG. 12. In this case, the electrode finger pitch of the comb-shaped electrode is preferably about 10 μm, and the number of pairs of the electrode fingers is set to 25 pairs. As is apparent from FIG. 12, large ripples exist in the vicinity of 300 MHz and in the vicinity of 900 MHz. The phase is determined by a ratio of a reactance portion to a resistance portion. The closer the phase is to −90 degrees, the smaller is the resistance portion, and thus a favorable capacitance is obtained. The larger the phase is, the more the resistance portion increases. Accordingly, in the capacitance element of the low-pass filter, it is necessary to avoid the frequency band in which the above-described ripples occur. When limiting to the area in which the phase becomes larger than about −85 degrees which is around the bottom, the frequency bands to be avoided are 275 MHz to 340 MHz and 825 MHz to 940 MHz.

Figure 13:
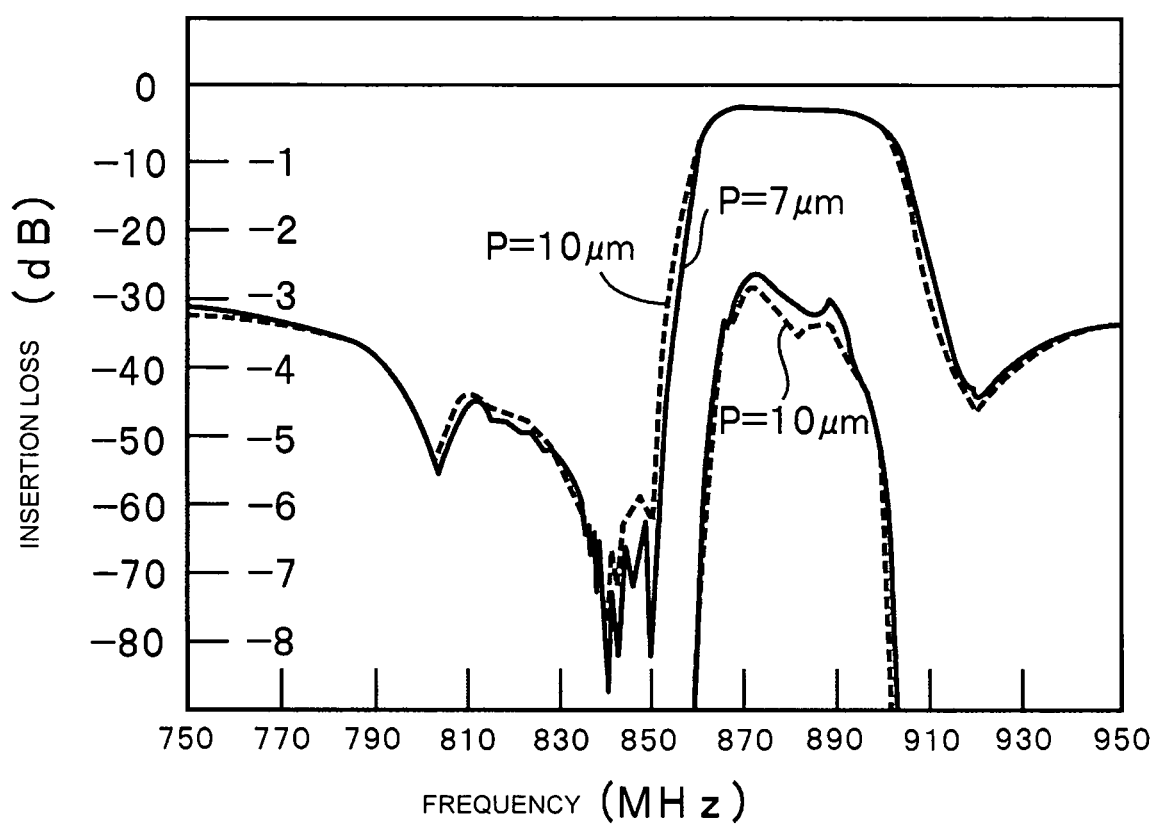
FIG. 13 is a diagram illustrating the frequency characteristics of the surface acoustic wave duplexer when an electrode-finger pitch of the comb-shaped electrode satisfies any one of the expressions (1) to (3), and when the pitch is not included in any one of the ranges (1) to (3).

Because the electrode-finger pitch is preferably about 10 μm, when the above-described frequency positions are converted into sound speed, the results are as follows: 5500 m/sec, 6800 m/sec, 16500 m/sec, and 18800 m/sec. Accordingly, a frequency from the lower limit frequency of the pass band of the filter having a relatively low pass band (that is, the transmission-side surface acoustic wave filter 3) to the higher limit frequency of the pass band of the filter having a relatively high pass band (that is, the receiving-side surface acoustic wave filter 4) needs to be outside the above-described range. Here, FIG. 13 shows the difference of the characteristics of when the pitch is outside of the range of the expressions (1) to (3), about 10 μm, and when pitch is within the range of the expressions (1) to (3), about 7 μm. Solid lines in FIG. 13 show the case of about 7 μm, and broken lines show the case of about 10 μm. As is shown in FIG. 13, when the comb-shaped electrode is arranged such that the alignment direction of electrode finger is a direction which is turned substantially 90 degrees with respect to the propagation direction of the surface acoustic wave, the loss can be reduced by meeting the expressions (1) to (3).

Also, when obtaining attenuation poles in the vicinity of the twofold wave and the threefold wave of the transmission-side pass band using the low-pass filter 6, the above-described ripples sometimes exist at the frequencies of the twofold wave and the threefold wave. If these ripples can be avoided, the in-band characteristics of two surface acoustic wave filters 3 and 4 and the attenuation of the attenuation poles can be prevented from deteriorating, and, thus, a more general and favorable surface acoustic wave duplexer is provided.

Also, in various preferred embodiments of the present invention, assuming that the lower limit frequency of the pass band of the filter of the transmission-side surface acoustic wave filter 3 is fTL, and the upper limit frequency of the pass band of the filter of the transmission-side surface acoustic wave filter 3 is fTH, the electrode-finger pitch P is even more desirable to be set in any one of the ranges of the following expressions (4) to (12).

$$5500/fH \geq 2 \times P \quad \text{Expression (4)}$$

$$6800/fL \leq 2 \times P \leq 16500/fH \quad \text{Expression (5)}$$

$$18800/fL \leq 2 \times P \quad \text{Expression (6)}$$

$$5500/(2 \times fTH) \geq 2 \times P \quad \text{Expression (7)}$$

$$6800/(2 \times fTL) \leq 2 \times P \leq 16500/(2 \times fTH) \quad \text{Expression (8)}$$

$$18800/(2 \times fTL) \leq 2 \times P \quad \text{Expression (9)}$$

$$5500/(3 \times fTH) \geq 2 \times P \quad \text{Expression (10)}$$

$$6800/(3 \times fTL) \leq 2 \times P \leq 16500/(3 \times fTH) \quad \text{Expression (11)}$$

$$18800/(3 \times fTL) \leq 2 \times P \quad \text{Expression (12)}$$

For example, as in the above-described preferred embodiment, when the transmission-side pass band is from about 824 MHz to about 849 MHz, and the receiving-side pass band is from about 869 MHz to about 894 MHz, the electrode-finger pitch is desirable to be limited in any one of the following ranges, and thereby the ripple can be outside the pass band, and outside of both areas of the twofold wave and the threefold wave of the transmission band.

(1) Less than 1.08 μm
(2) 1.37 to 1.62 μm
(3) 2.06 to 3.08 μm
(4) 4.13 to 4.86 μm
(5) 5.70 to 9.22 μm
(6) 11.4 μm or more Also, in the above-described preferred embodiment, the capacitance element of the low-pass filter preferably includes a comb-shaped electrode, however, the capacitance element may be constructed by adopting a structure other than the comb-shaped electrode. For example, the capacitance element may be formed by the structure in which a first electrode, a dielectric material, and a second electrode are laminated on a piezoelectric substrate. In this case, a Q-value is determined by a tan δ of the dielectric material. It is therefore possible to reduce loss using a dielectric film having a favorable tan δ.

In the present preferred embodiment, the capacitance elements 22 to 24, which are formed using the above-described comb-shaped electrodes, are disposed on the piezoelectric substrate 21 of the receiving-side surface acoustic wave filter 4. However, they may be disposed on the transmission-side surface acoustic wave filter 3. In a surface acoustic wave duplexer, because a large power is applied to the transmission-side surface acoustic wave filter 3, the transmission-side surface acoustic wave filter 3 is usually constructed to include more multiple-staged elements. Accordingly, the transmission-side surface acoustic wave filter 3 usually has a larger-size chip compared with the receiving-side surface acoustic wave filter 4. Thus, as in the above-described preferred embodiment, by disposing the capacitance elements 22 to 24 on the receiving-side surface acoustic wave filter 4, the chip size of the receiving-side surface acoustic wave filter 4 and that of the transmission-side surface acoustic wave filter 3 can be close to each other, or their sizes can be substantially the same. With this arrangement, the handling can be improved when manufacturing the surface acoustic wave duplexer 1, and at the same time, the reliability of the junction portion of the receiving-side surface acoustic wave filter 4 and the package material 11 can be increased.

Furthermore, by disposing the capacitance elements of the low-pass filter in the vicinity of the antenna end of the receiving-side surface acoustic wave filter 4, the capacitive coupling and the inductive coupling between the signal terminal of the transmission-side surface acoustic wave filter 3 and the output terminal of the receiving-side surface acoustic wave filter can be prevented. Thus, a surface acoustic wave duplexer having an excellent isolation characteristic is provided.

Figure 16:
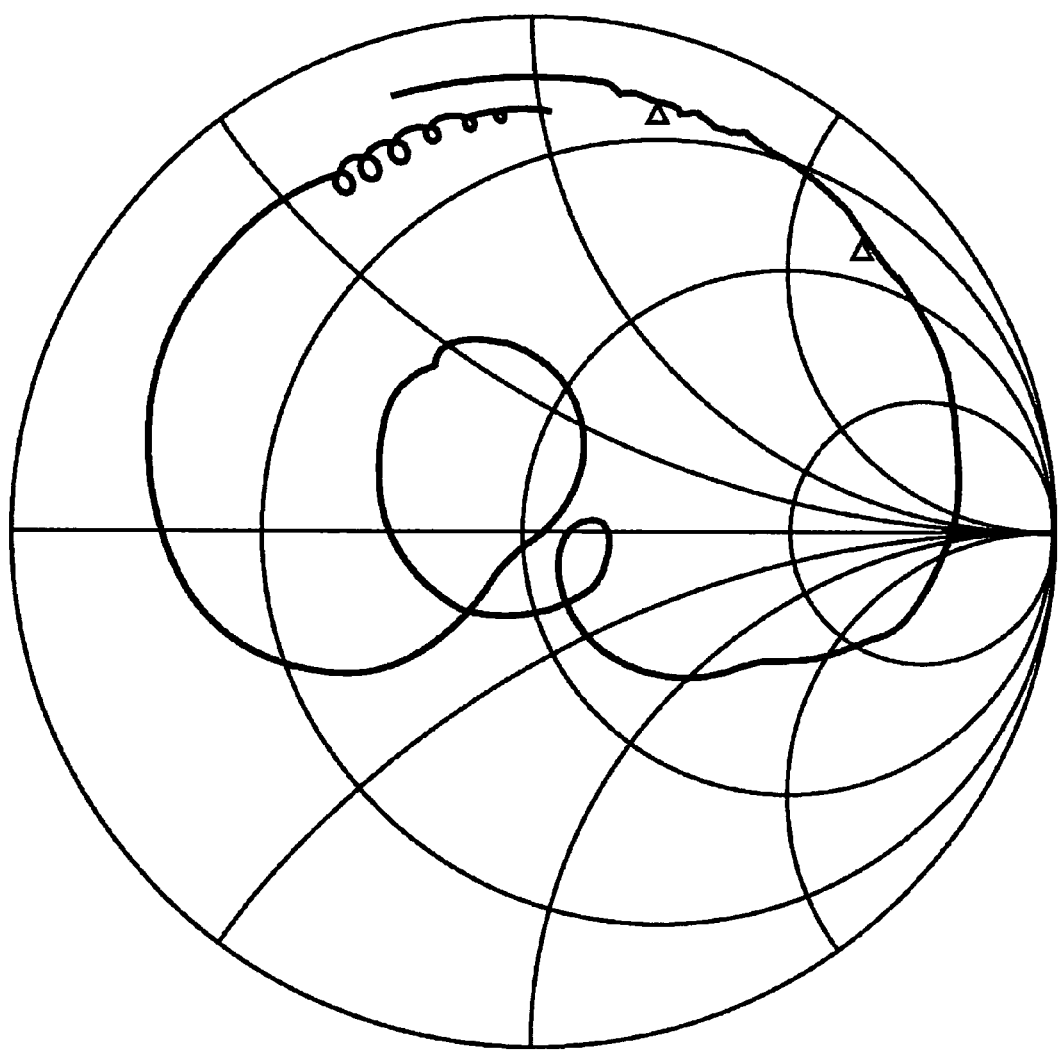
FIG. 16 is a Smith chart illustrating the impedance characteristic of the receiving-side surface acoustic wave filter when the amount of phase delay in the phase-matching circuit is about 75 degrees.

In the surface acoustic wave duplexer 1, the amount of phase delay by the phase-matching element 7 is preferably about 75 degrees. In this case, for the transmission-side surface acoustic wave filter 3, the receiving-side surface acoustic wave filter 4 appears as an inductive element. That is to say, an inductance is added in parallel to the transmission-side surface acoustic wave filter 3. The impedance characteristic of the receiving-side surface acoustic wave filter 4 for this case is shown in Smith chart in FIG. 16.

Figure 17:
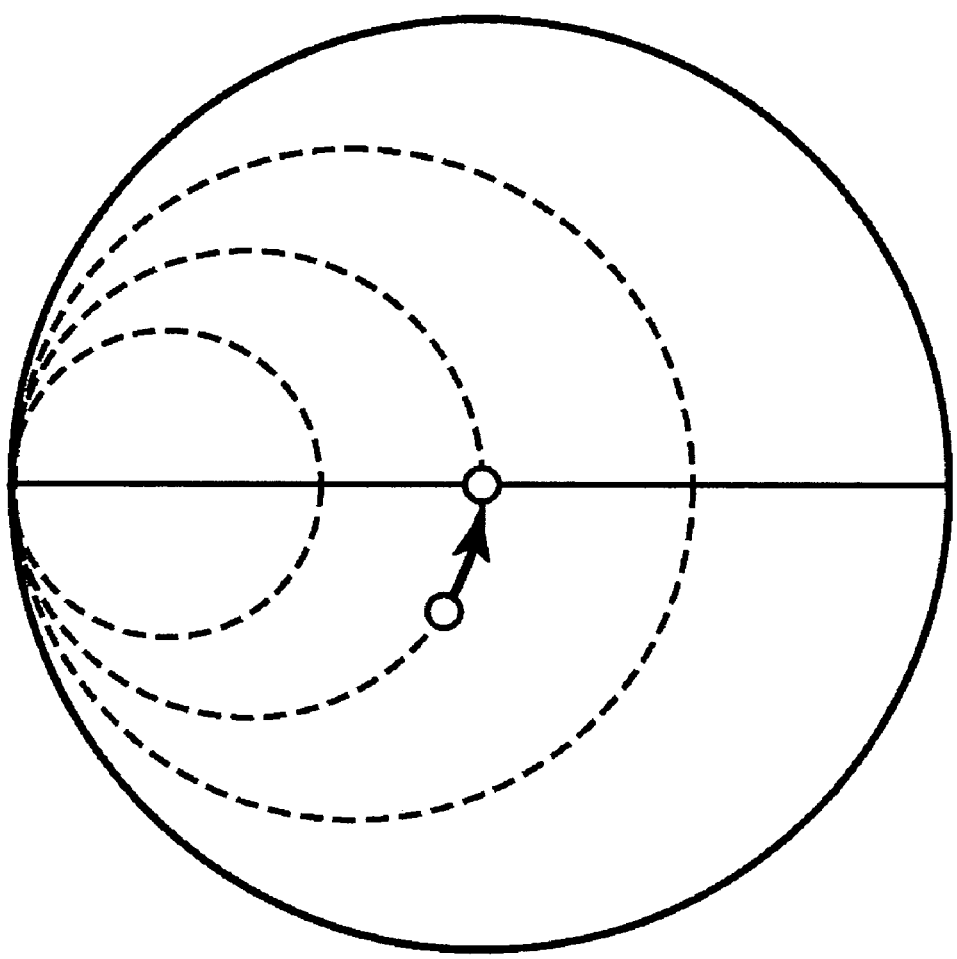
FIG. 17 is a Smith chart illustrating the change of the matching state of the transmission-side surface acoustic wave filter of the surface acoustic wave duplexer when a amount of phase delay in the phase-matching element is less than about 90 degrees.
Figure 18:
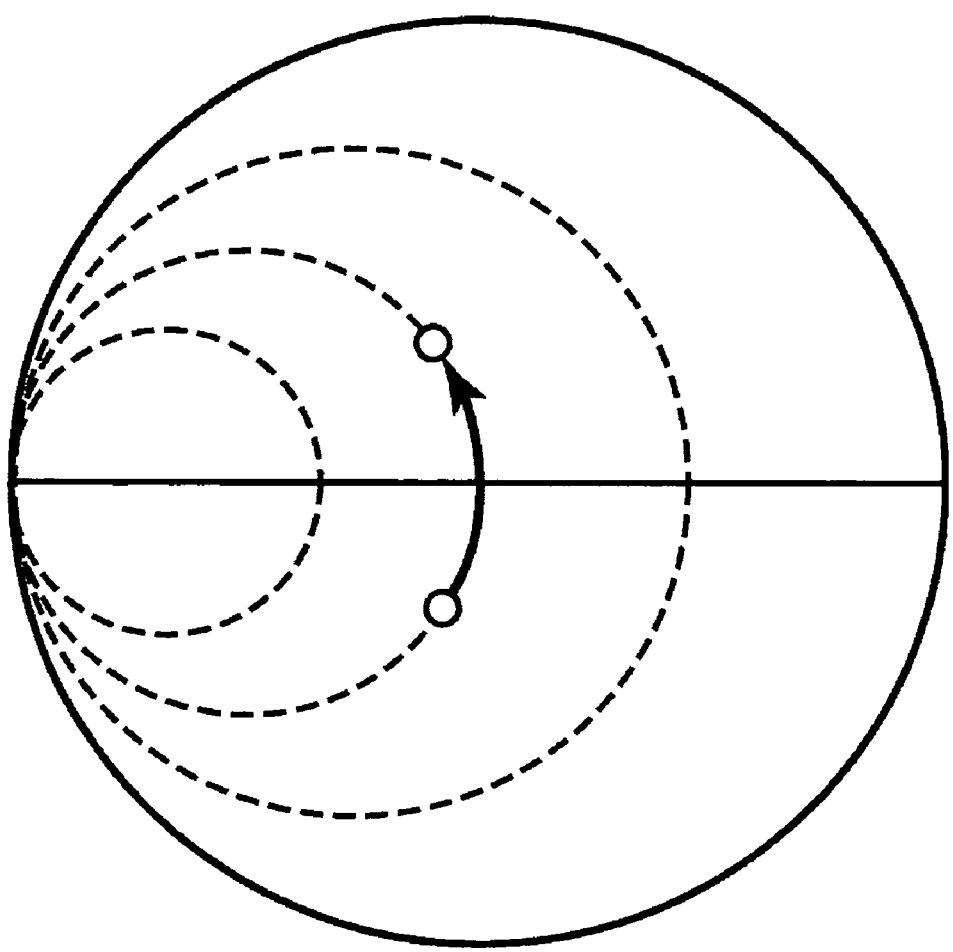
FIG. 18 is a Smith chart illustrating the change of the matching state of the transmission-side surface acoustic wave filter when the amount of phase delay of the phase-matching element is about 60 degrees.
Figure 19:
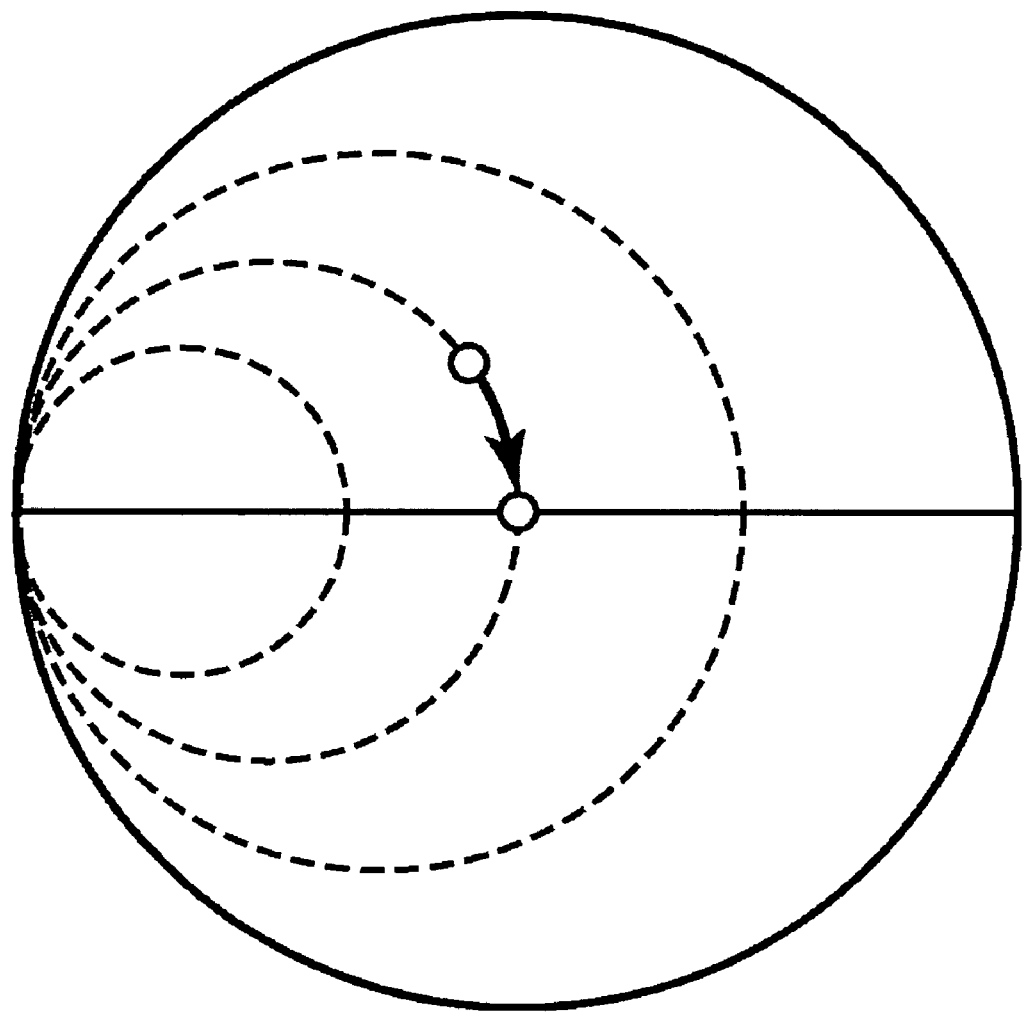
FIG. 19 is a Smith chart illustrating the change of the matching state of the transmission-side surface acoustic wave filter when the impedance is controlled by the capacitance component of the high-frequency wave element.
Figure 20:
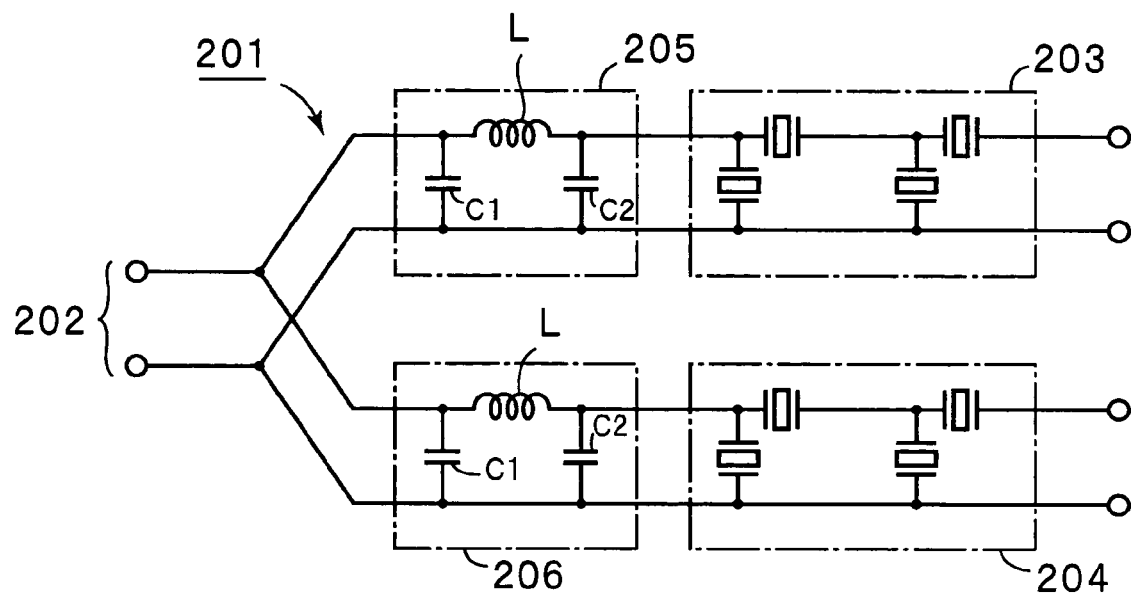
FIG. 20 is a circuit diagram illustrating an example of the conventional surface acoustic wave duplexer.
Figure 21:
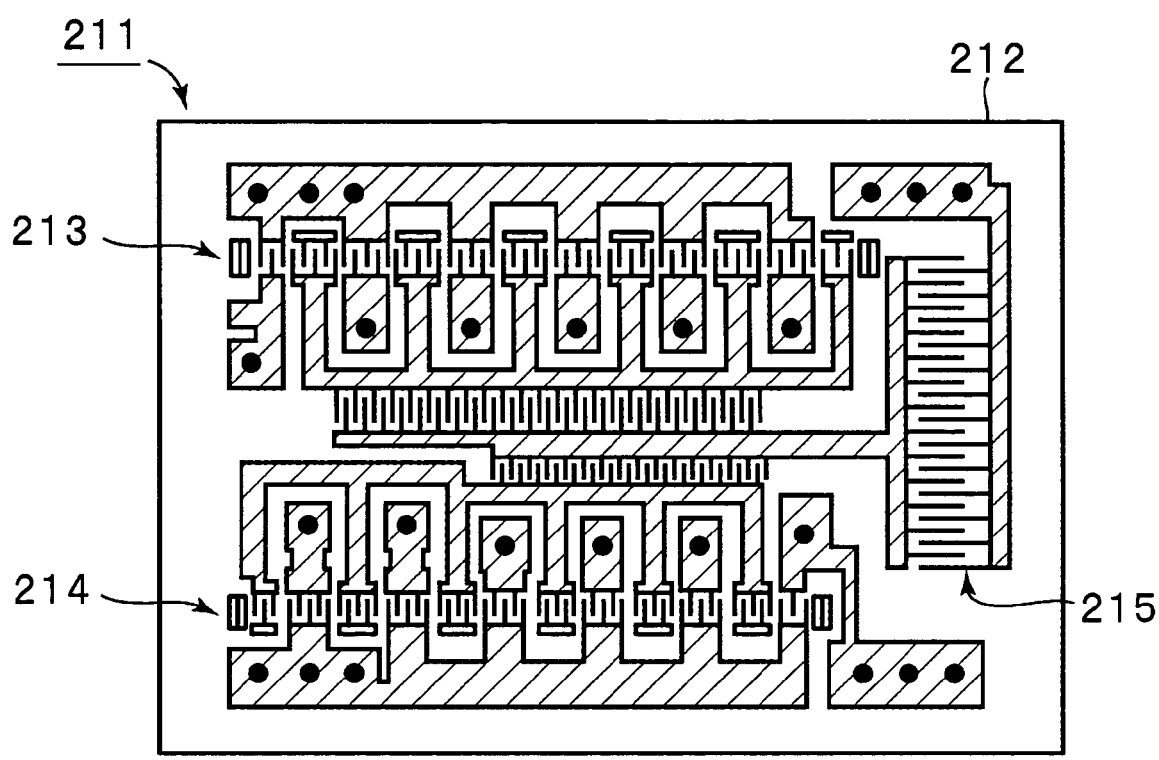
FIG. 21 is a schematic plan view illustrating the structure in which comb-shaped capacitance electrodes are formed on the piezoelectric substrate in the conventional surface acoustic wave filter in order to match impedance.

When designing a surface acoustic wave duplexer, if it is intended to expand the band in the characteristic of the single surface acoustic wave filter, the capacitive value falls, so that matching can be obtained in real axis by adding a parallel inductance having an optimum value. Accordingly, by setting the amount of phase delay to less than about 90 degrees, the matching state at the antenna end of the surface acoustic wave duplexer 1 can be close to approximately 50 Ω matching as shown by an arrow in the matching state of the transmission-side surface acoustic wave filter in the Smith chart of FIG. 17. However, when the amount of phase delay is smaller than about 60 degrees, it becomes too inductive as shown by an arrow in the Smith chart of the matching state of the transmission-side surface acoustic wave filter of FIG. 18. Thus, the matching state deteriorates conversely. In this case, as shown by an arrow in the Smith chart of the matching state of the transmission-side surface acoustic wave filter of FIG. 19, the impedance is controlled by the capacitance component of the low-pass filter to have too much of an inductive component, and thereby the impedance matching can be obtained.

However, if the amount of phase delay becomes too small, the conductor portion becomes too large, and thus the loss of the transmission-side surface acoustic wave filter 3 is deteriorated. Thus, the phase rotation amount is preferably about 60 degrees or more. Also, in order to achieve miniaturization and to obtain matching on the real axis of the filter having the decreased capacitive value, the phase rotation amount is desirable to be less than about 80 degrees. That is to say, by setting the phase rotation amount to be between about 60 degrees and about 80 degrees, it is possible to provide a surface acoustic wave duplexer 1 which is small-sized and has an excellent matching state.

In this regard, in the above-described preferred embodiment, the transmission-side surface acoustic wave filter 3 and the receiving-side surface acoustic wave filter 4 are formed on an individually independent piezoelectric substrate. However, the transmission-side surface acoustic wave filter 3 and the receiving-side surface acoustic wave filter 4 may be formed on the same piezoelectric substrate.

Also, for the joining method of the surface acoustic wave filters 3 and 4 on the package material 11, the method is not limited to the method using bumps and the method may be a joining method using wire bonding.

In this regard, in the above-described preferred embodiment, in a structure in which surface acoustic wave filters 3 and 4 are joined on the package material 11 by the bumps, as described above, it is desirable to construct the transmission-side surface acoustic wave filter 3 and the receiving-side surface acoustic wave filter 4 on independent piezoelectric substrates. As a result of this structure, it is possible to increase the joining strength of the surface acoustic wave filters 3 and 4 and the package material 11. Also, as described above, when constructing the transmission-side surface acoustic wave filter 3 and the receiving-side surface acoustic wave filter 4 on independent piezoelectric substrates, it is desirable to mount a capacitance element for constituting the above-described high-frequency suppression element on the receiving-side surface acoustic wave filter 4.

Also, in the above-described preferred embodiment, the strip lines 15 and 16 of the phase-matching element and the inductance elements 29 and 30 are formed over a plurality of layers and are individually located on the same plane. However, the strip lines 15 and 16 and the inductance elements 29 and 30 may be formed on different planes in the package material 11. Also, the strip lines 15 and 16 and the inductance elements 29 and 30 are not necessarily formed over a plurality of layers. However, by forming them on the same plane and over a plurality of layers as in the above-described preferred embodiment, the structure which includes inductance elements and strip lines can be miniaturized and the cost can be reduced.

In the above-described preferred embodiment, the phase-shift amount by the phase-matching element 7 is preferably set to about 75 degrees. However, the phase-shift amount is not limited to this, and in general, a phase-matching element whose phase can be rotated, from short circuit to open circuit, by about 90 degrees, may be used. Incidentally, the package material 11 can be miniaturized by setting the amount of phase delay to about 75 degrees, which is rather short, as the preferred embodiment described above. In addition, by including the impedance of the low-pass filter, it is possible to provide a surface acoustic wave duplexer 1 having a favorable impedance matching.

The surface acoustic wave duplexer according to the present invention can achieve various effects by various structures as described above. However, in the present invention, preferably as in the above-described preferred embodiment, the high-frequency suppression element 6 is preferably constructed to include the first through third capacitance elements 22 to 24 and the inductance elements 29 and 30. Specifically, the inductance elements 29 and 30 are preferably included in the package material, and the capacitance elements 22 to 24 are disposed on the piezoelectric substrate constituting the surface acoustic wave filter 4. Accordingly, preferred embodiments of the present invention has an advantage that a surface acoustic wave duplexer, which is more miniaturized and which can be shorter in height, can be provided.

When the above-described inductance element is formed on the piezoelectric substrate of the surface acoustic wave filter, it is necessary to form the inductance element by a thin-film process or suitable method. In this case, an inductance element having a high Q-value is difficult to obtain. On the other hand, as in the above-described preferred embodiment, when the inductance elements 29 and 30 are included in the package material 11 (in particular, when they are formed over a plurality of layers at the same time that the phase-matching strip lines 15 and 16 are formed over a plurality of layers and formed on the same plane as the phase-matching strip lines 15 and 16) an inductance which is small-sized and has a high Q-value is achieved.

Furthermore, when the Q-value of the above-described inductor, which is added to the surface acoustic wave duplexer, is inferior, not only is the attenuation at an attenuation pole not sufficiently large, but also the deterioration of the loss in the pass band occurs. Also, when forming the capacitance element in the package material, three capacitance elements are necessary. Accordingly, in the structure in which the capacitance element is included in the package material, it becomes difficult to prevent a capacitance coupling with the other elements such as the above-described inductance elements and the strip lines. Thus, this arrangement has the disadvantages of not achieving miniaturization or shortening in height. Therefore, by forming the capacitance element on the piezoelectric substrate, it becomes possible not only to shorten the height, but also to prevent undesirable coupling with the other elements in the package material. Thus, a favorable low-pass characteristic is obtained.

Also, when forming a capacitance electrode on a piezoelectric substrate of a capacitance element in a structure in which the alignment direction of electrode elements of the comb-shaped electrode is turned substantially 90 degrees with respect to the propagation direction of the surface acoustic wave, as described above, a ripple caused by the capacitance of the capacitance element can be suppressed so as not to occur in the pass bands of the surface acoustic wave filters 3 and 4. Thus, a suppression element having a further low loss and attenuation can be formed.

Accordingly, in the surface acoustic wave duplexer of preferred embodiments of the present invention, which is the combination of the above-described various arrangements, it is possible to provide a surface acoustic wave duplexer which has a more favorable characteristic, and which can be miniaturized and be shorter in height.

Figure 14:
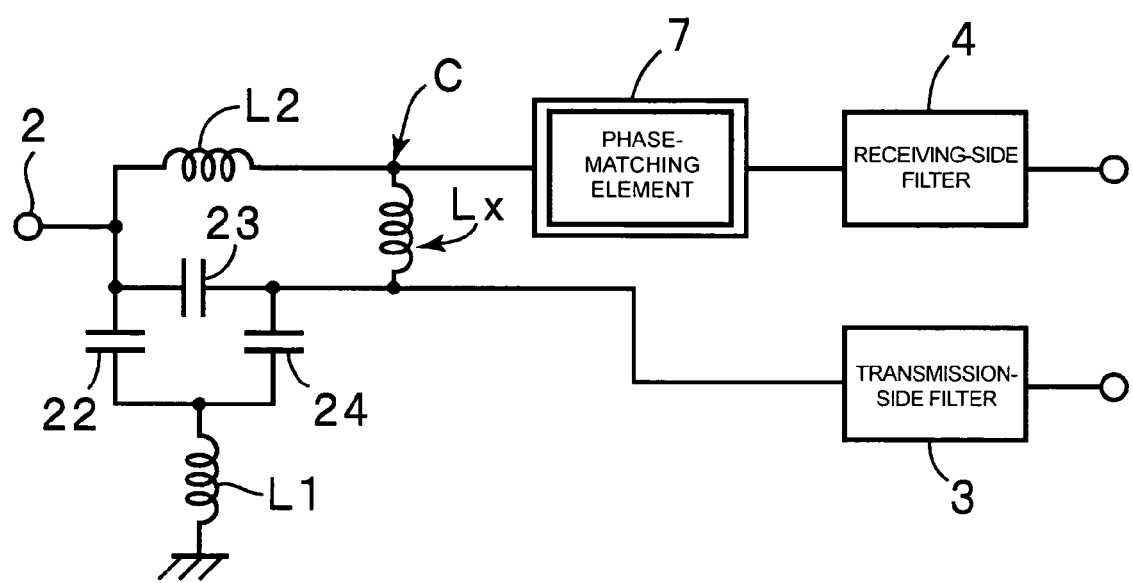
FIG. 14 is a diagram illustrating the circuitry of the surface acoustic wave duplexer including a parasitic inductance element connected to the high-frequency wave element.

In particular, in the low-pass filter 6 having two attenuation poles shown in FIG. 4 combined with the surface acoustic wave duplexer, if a parasitic component is entered in a specific portion, an attenuation pole sharply deteriorates. Specifically, if a parasitic inductor component Lx is entered into the position indicated by an arrow C in FIG. 14, the trap attenuation pole deteriorates sharply. A description of this will be provided with reference to FIG. 15. A solid line in FIG. 15 indicates the frequency characteristic of the low-pass filter 6 when there is no parasitic component, a chain-dotted line indicates the frequency characteristic of the case where the parasitic component magnitude is about 0.1 nH, and a broken line indicates the frequency characteristic of the case where the parasitic component magnitude is about 0.5 nH.

Figure 15:
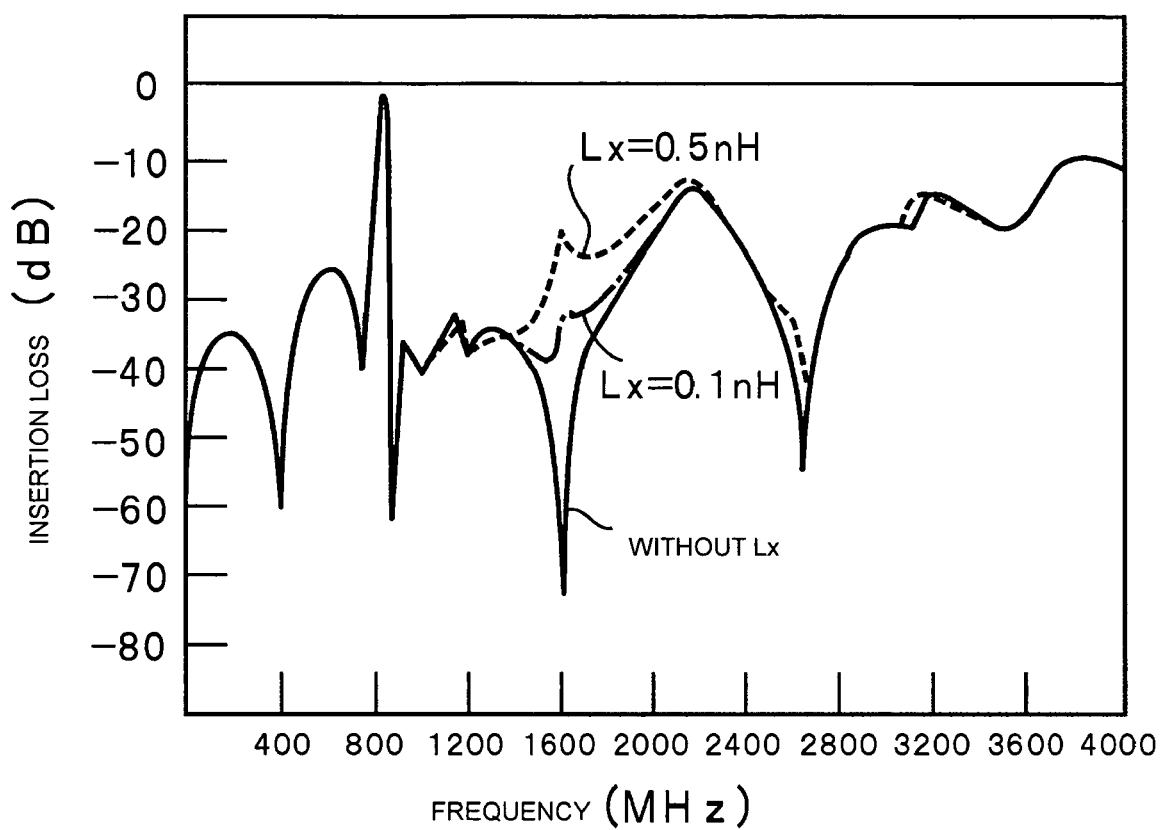
FIG. 15 is a diagram illustrating the frequency characteristics of the frequency suppression element when the parasitic inductance element shown in FIG. 14 does not parasite and when the parasitic inductance element is inserted.

As is shown in FIG. 15, by the insertion of the above-described parasitic inductor component Lx, the attenuation of the twofold wave of the pass band is extremely deteriorated.

In order to prevent the impact of the parasitic inductor component Lx as described above, in the structure in which the inductance elements 29 and 30 are included in the package material 11, the terminal which is connected to the transmission-side terminal of the strip lines 15 and 16 and the terminal which is connected to the transmission-side terminal of the inductance elements 29 and 30 are parasitic not in the package material, but are preferably parasitic on the surface which is joined by the bump of the package material 11. As a result, the above-described parasitic inductor component Lx can be minimized as much as possible.

In the surface acoustic wave duplexer according to the first preferred embodiment of the present invention, the surface acoustic wave duplexer, in which a transmission-side surface acoustic wave filter and a receiving-side surface acoustic wave filter are mounted on the package material, is provided with a high-frequency wave element which is connected to the transmission-side surface acoustic wave filter and the receiving-side surface acoustic wave filter and has two trap attenuation poles at frequencies higher than the transmission-side pass band. Thus, an undesirable frequency of frequencies higher than the transmission-side pass band, a ripple, and other undesirable effects are suppressed and minimized by the two trap attenuation poles, and thereby, a surface acoustic wave duplexer having a favorable frequency characteristic is provided.

When the two trap attenuation poles are located at a twofold wave and a threefold wave of the transmission-side pass band or in the vicinity thereof, the attenuation of the twofold wave and a threefold wave of the transmission-side pass band can be suppressed.

When the high-frequency wave element has first and second inductors and first through third capacitance elements and the two trap attenuation poles are formed by the first and the second inductors and the first to the third capacitance elements, a high-frequency wave element having the above-described two trap attenuation poles can be composed of only five elements.

When the first through third capacitance elements have a delta-type connection, a first inductor is connected between the first common terminal and ground potential and a second inductor is connected between the second and third common terminals. Thus, the number of capacitance elements constituting the high-frequency wave element can be reduced, the total value of the capacitance and the inductance can be increased, and the miniaturization of the surface acoustic wave duplexer is achieved. When the first trap attenuation pole occurs at the twofold wave of the pass band of the transmission-side surface acoustic wave filter or in the vicinity thereof by an anti-resonance of the second inductor and a capacitance element connected, in parallel, to the second inductor and the second trap attenuation pole occurs at the threefold wave of the pass band of the transmission-side surface acoustic wave filter or in the vicinity thereof by a resonance of the capacitance which has been obtained in a Y-type connection equivalent to a delta-type connection of the first to the third capacitance elements and the first inductor, the surface acoustic wave duplexer can be miniaturized.

Also, in the surface acoustic wave duplexer according to the second preferred embodiment, one end of the transmission-side surface acoustic wave filter and one end of the receiving-side surface acoustic wave filter are connected at a common connection point, a high-frequency wave element is provided only between the common connection point and the antenna resonance terminal, and the inductor is formed in the package material. Thus, the high-frequency characteristic can be improved, and the miniaturization of the surface acoustic wave duplexer can be achieved.

When a phase-matching strip line is further disposed in the package material, wherein the inductor included in the high-frequency wave element is formed on the same plane of the package material as the strip line, the miniaturization of the surface acoustic wave duplexer is further be achieved. At the same time, the capacitive coupling and the inductive coupling between the strip line and the inductor does not easily occur, and thus, a surface acoustic wave duplexer which does not cause the deterioration of the attenuation band can be provided. When the inductor is disposed over two layers or more in the package material in order to strengthen inductivity, the self-induction in the inductor can be increased, and thus, the surface acoustic wave duplexer can further be miniaturized.

When both of the strip line and the inductor are formed over two layers or more and on the same two layers or more, the surface acoustic wave duplexer can be miniaturized, and the deterioration of the attenuation band can be prevented. At the same time, the inductor and the strip line are formed in the same step in the manufacturing process, and thus the manufacturing cost can be reduced.

The surface acoustic wave duplexer according to the third preferred embodiment includes the package material on which the transmission-side surface acoustic wave filter and the receiving-side surface acoustic wave filter are mounted and a high-frequency wave element which has at least one inductor and at least one capacitance element. The capacitance element includes a comb-shaped electrode disposed on the piezoelectric substrate of the transmission-side and/or the receiving-side surface acoustic wave filter. The direction along an electrode-finger pitch of the comb-shaped electrode is a direction which is turned substantially 90 degrees with respect to the propagation direction of the surface acoustic wave in the surface acoustic wave filter on which the comb-shaped electrode is provided. Accordingly, relatively large capacitance can be obtained in the same area. Also, the above-described capacitance element is difficult to respond to a surface acoustic wave, thus undesirable ripples do not easily occur. Also, the ripple which occurs by the capacitance element is not located at the pass band of the receiving-side surface acoustic wave filter and at the twofold wave and the threefold wave of the pass band of the transmission-side or in the vicinity thereof. Thus, a surface acoustic wave duplexer having a favorable frequency characteristic can be provided.

In the third preferred embodiment, when the piezoelectric substrate is made of a $LiTaO_3$ substrate, and the period P of the electrode finger of the comb-shaped electrode constituting the capacitance element falls in any one of the ranges of the above-described expressions (1) to (3), a surface acoustic wave duplexer having a low loss can be provided. In particular, when the above-described expressions (4) to (12) are met, the ripple by the capacitance element is outside the pass band of the receiving-side surface acoustic wave filter and the twofold wave and the threefold wave of the pass band of the transmission-side or in the vicinity thereof without fail.

In the surface acoustic wave duplexer according to the fourth preferred embodiment, the capacitance element is formed by forming the laminated structure including the first electrode film, the second electrode film, and the insulation film on a piezoelectric substrate of the transmission-side and/or the receiving-side surface acoustic wave filter. Thus, the capacitance element can be easily formed by forming these films on the piezoelectric substrate by a package manufacturing process.

In the surface acoustic wave duplexer according to the third and the fourth preferred embodiment, when the transmission-side surface acoustic wave filter and the receiving-side surface acoustic wave filter are formed using individual piezoelectric substrates and a capacitance element for forming the high-frequency wave element is formed on the piezoelectric substrate of the receiving-side surface acoustic wave filter, the joining strength between each of the surface acoustic wave filters and the package material can be easily increased, the size of the transmission-side surface acoustic wave filter and that of the receiving-side surface acoustic wave filter can be close to each other, and the handling can be improved during manufacturing.

When the capacitance element of the high-frequency wave element is formed in the vicinity of an antenna-terminal side portion of the receiving-side surface acoustic wave filter, the capacitive coupling and the inductive coupling between the signal terminal of the transmission-side surface acoustic wave filter and the output terminal of the receiving-side surface acoustic wave filter can be prevented. Thus, the isolation and the retardation characteristic are improved.

When the transmission-side surface acoustic wave filter and the receiving-side surface acoustic wave filter are formed on the same piezoelectric substrate and the capacitance element of the high-frequency wave element is formed in the vicinity of an end of the antenna-terminal side of the receiving-side surface acoustic wave filter, the transmission-side surface acoustic wave filter and the receiving-side surface acoustic wave filter can be composed of one piezoelectric substrate and the assembling work can be simplified.

Also, when the capacitance element is disposed in the vicinity of an end of the antenna-terminal side of the receiving-side surface acoustic wave filter, the capacitive coupling and the inductive coupling between the transmission-signal terminal of the transmission-side surface acoustic wave filter and the output terminal of the receiving-side surface acoustic wave filter can be suppressed. Thus, the isolation is improved.

In the surface acoustic wave duplexer according to the fifth preferred embodiment, the inductor is formed in the package material and the capacitance element is formed on a piezoelectric substrate of the transmission-side surface acoustic wave filter and/or the receiving-side surface acoustic wave filter. The surface acoustic wave duplexer can be miniaturized. At the same time, because the capacitance element is formed on the piezoelectric substrate, the transmission-side surface acoustic wave filter and the receiving-side surface acoustic wave filter can be multifunctional.

In the surface acoustic wave duplexer according to the sixth preferred embodiment, the piezoelectric substrate including the transmission-side surface acoustic wave filter and the receiving-side surface acoustic wave filter is preferably a LiTaO$_3$ substrate, the capacitance-element of the high-frequency wave element includes a comb-shaped electrode formed on the piezoelectric substrate, the comb-shaped electrode is disposed in a direction which is rotated by substantially 90 degrees with respect to a propagation direction of a surface acoustic wave in the surface acoustic wave filter. Thus, undesirable ripples caused by the comb-shaped electrode do not easily occur. Also, the period of the electrode finger of the comb-shaped electrode preferably falls in the ranges of the above-described expressions (1) to (3). Thus, a surface acoustic wave duplexer having a low loss can be provided.

The surface acoustic wave duplexer according to the seventh preferred includes at least one phase-matching element and a low-pass filter, wherein the low-pass filter is connected between the antenna terminal and the transmission-side surface acoustic wave filter and connected between the antenna terminal and the receiving-side surface acoustic wave filter and the low-pass filter has both of a low-pass filter function and an antenna-matching function. Thus, the attenuation in the pass band can be improved in accordance with the present invention, and a surface acoustic wave duplexer, which has a favorable frequency characteristic and is easy to match impedance with the antenna, is provided.

When the phase-matching element is disposed between a surface acoustic wave filter having a relatively high frequency and an antenna terminal and the amount of phase delay in the phase-matching element is less than about 90 degrees at the center frequency of the surface acoustic wave filter having a relatively low frequency, the matching state at the antenna end of the surface acoustic wave duplexer can be close to 50 Ω. In particular, when the amount of phase delay is in the range of about 60 to about 80 degrees, a more favorable matching state can be achieved.

When the impedance at the antenna terminal of the surface acoustic wave duplexer excluding the low-pass filter is inductive at least in a frequency range of 50% or more of each pass band width of a transmission-side surface acoustic wave filter and a receiving-side surface acoustic wave filter, an impedance in a pass band of the low-pass filter is capacitive, and the matching is obtained on a real axis when viewed from the antenna side.

The surface acoustic wave duplexer according to the eighth and the ninth preferred embodiments includes the surface acoustic wave duplexer according to the first to the fourth preferred embodiments, and thus, the duplexer has a favorable frequency characteristic which can easily be miniaturized. Furthermore, a surface acoustic wave duplexer, in which the attenuation in the high frequency can be improved and an undesirable ripple does not easily occur, can be provided. In particular, when the high-frequency wave element has two trap attenuation poles at a twofold wave and a threefold wave or in the vicinity thereof, the high-frequency wave element has the first through third capacitance elements connected to a delta-type connection, the second inductor is formed on the same layers as that of the phase-adjusting strip line disposed in the package material, and the terminal which is connected to the transmission-side signal terminal of the strip line and the terminal which is connected to the transmission-side signal terminal of the second inductor are short-circuited in the package material, the attenuation in the attenuation band of the high frequency of the transmission-side surface acoustic wave filter is sufficiently improved. Accordingly, the loss characteristic of the receiving-side surface acoustic wave filter is effectively improved, and at the same time, the surface acoustic wave duplexer is easily miniaturized and shortened in height. Furthermore, a surface acoustic wave duplexer which is easy for matching impedance and which is easy to manufacture is provided.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave duplexer comprising:
   an antenna terminal;
   a transmission-side surface acoustic wave filter connected to the antenna terminal;
   a receiving-side surface acoustic wave filter connected to the antenna terminal;
   a package material on which the transmission-side surface acoustic wave filter and the receiving-side surface acoustic wave filter are mounted; and
   a high-frequency wave element connected to the transmission-side surface acoustic wave filter and the receiving-side surface acoustic wave filter; wherein
   the high-frequency wave element has two trap attenuation poles at frequencies higher than the frequencies of the transmission-side pass band; and
   the high-frequency wave element includes first and second inductors and first, second, and third capacitance elements, and the two trap attenuation poles are formed by the first and the second inductors and the first, second, and third capacitance elements.

2. A surface acoustic wave duplexer according to claim 1, wherein the first, second, and third capacitance elements have a delta-type connection in which two of the capacitance elements are connected to each of first, second, and third common terminals;
   the first inductor is connected between the first common terminal and a ground potential; and
   the second inductor is connected between the second and third common terminals.

3. A surface acoustic wave duplexer according to claim 2, wherein a first trap attenuation pole is approximately equal to a twofold wave of a pass band of the transmission-side surface acoustic wave filter by an anti-resonance of the second inductor and a capacitance element connected in parallel to the second inductor; and a second trap attenuation pole is approximately equal to a threefold wave of a pass band of the transmission-side surface acoustic wave filter by a resonance of a capacitance which has been obtained in a T-type connection equivalent to the delta-type connection of the first to the third capacitance elements and the first inductor.

4. A surface acoustic wave duplexer comprising:
an antenna terminal;
a transmission-side surface acoustic wave filter connected to the antenna terminal;
a receiving-side surface acoustic wave filter connected to the antenna terminal;
a package material on which the transmission-side surface acoustic wave filter and the receiving-side surface acoustic wave filter are mounted;
a high-frequency wave element includes at least one inductor and at least one capacitance element;
a common connecting point connected to one end of the transmission-side surface acoustic wave filter and connected to one end of the receiving-side surface acoustic wave filter; and
a phase-matching strip line disposed in the package material; wherein
the high-frequency wave element is disposed only between the common connection point and the antenna terminal;
the inductor included in the high-frequency wave element is disposed in the package material; and
the inductor included in the high-frequency wave element is located on the same plane of the package material as the strip line.

5. A surface acoustic wave duplexer according to claim 4, wherein the strip line and the inductor are disposed on at least two layers; and
the strip line and the inductor are disposed on the same at least two layers.

6. A surface acoustic wave duplexer comprising:
an antenna terminal;
a transmission-side surface acoustic wave filter connected to the antenna terminal;
a receiving-side surface acoustic wave filter connected to the antenna terminal;
a package material on which the transmission-side surface acoustic wave filter and the receiving-side surface acoustic wave filter are mounted;
a high-frequency wave element includes at least one inductor and at least one capacitance element; and
a common connecting point connected to one end of the transmission-side surface acoustic wave filter and connected to one end of the receiving-side surface acoustic wave filter; wherein
the high-frequency wave element is disposed only between the common connection point and the antenna terminal;
the inductor included in the high-frequency wave element is disposed in the package material; and
the inductor is disposed so as to increase a magnetic flux over at least two layers in the package material.

7. A surface acoustic wave duplexer according to claim 6, wherein the strip line and the inductor are disposed on at least two layers; and
the strip line and the inductor are disposed on the same at least two layers.

8. A surface acoustic wave duplexer comprising:
an antenna terminal;
a transmission-side surface acoustic wave filter which is connected to the antenna terminal and includes a piezoelectric substrate;
a receiving-side surface acoustic wave filter which is connected to the antenna terminal and includes a piezoelectric substrate;
a package material on which the transmission-side surface acoustic wave filter and the receiving-side surface acoustic wave filter are mounted; and
a high-frequency wave element which includes at least one inductor and at least one capacitance element; wherein
the capacitance element includes a comb-shaped electrode disposed on the piezoelectric substrate of the transmission-side and/or the receiving-side surface acoustic wave filter;
a direction along an electrode-finger pitch of the comb-shaped electrode is turned substantially 90 degrees with respect to a propagation direction of the surface acoustic wave in the surface acoustic wave filter on which the comb-shaped electrode is disposed; and
a ripple which occurs by the capacitance element is not located in the vicinity of a twofold wave and a threefold wave of a pass band of the transmission-side surface acoustic wave filter and a pass band of the receiving-side surface acoustic wave filter.

9. A surface acoustic wave duplexer according to claim 8, wherein the piezoelectric substrate is a $LiTaO_3$ substrate, a pitch of an electrode finger of the comb-shaped electrode constituting the capacitance element falls in any one of the ranges of the following expressions:

$$5500/fH \geq 2 \times P$$

$$6800/fL \leq 2 \times P \leq 16500/fH$$

$$18800/fL \leq 2 \times P$$

where fH is an upper limit frequency of the pass band of the receiving-side surface acoustic wave filter, fL is a lower limit of the pass band of the filter of the transmission-side surface acoustic wave filter, and P is an electrode-finger pitch of the comb-shaped electrode.

10. A surface acoustic wave duplexer according to claim 8, wherein the pitch of the electrode finger of the comb-shaped electrode falls in any one of the ranges of the following expressions:

$$5500/fH \geq 2 \times P$$

$$6800/fL \leq 2 \times P \leq 16500/fH$$

$$18800/fL \leq 2 \times P$$

$$5500/(2 \times fTH) \geq 2 \times P$$

$$6800/(2 \times fTL) \leq 2 \times P \leq 16500/(2 \times fTH)$$

$$18800/(2 \times fTL) \leq 2 \times P$$

$$5500/(3 \times fTH) \geq 2 \times P$$

$$6800/(3 \times fTL) \leq 2 \times P \leq 16500/(3 \times fTH)$$

$$18800/(3 \times fTL) \leq 2 \times P$$

where fTL is a lower limit frequency of the pass band of the transmission-side surface acoustic wave filter, fTH is an upper limit frequency of the pass band of the transmission-side surface acoustic wave filter, and P is an electrode-finger pitch of the comb-shaped electrode.

11. A surface acoustic wave duplexer according to claim 8, wherein the transmission-side surface acoustic wave filter and the receiving-side surface acoustic wave filter have individual piezoelectric substrates, and a capacitance element of the high-frequency wave element is disposed on the piezoelectric substrate of the receiving-side surface acoustic wave filter.

12. A surface acoustic wave duplexer according to claim 11, wherein the capacitance element of the high-frequency wave element is disposed in the vicinity of an end of an antenna-terminal side of the receiving-side surface acoustic wave filter.

13. A surface acoustic wave duplexer according to claim 8, wherein the transmission-side surface acoustic wave filter and the receiving-side surface acoustic wave filter are disposed on the same piezoelectric substrate, and a capacitance element of the high-frequency wave element is disposed in the vicinity of an end of an antenna-terminal side of the receiving-side surface acoustic wave filter.

14. A surface acoustic wave duplexer comprising:
an antenna terminal;
a transmission-side surface acoustic wave filter which is connected to the antenna terminal and includes a piezoelectric substrate;
a receiving-side surface acoustic wave filter which is connected to the antenna terminal, and includes a piezoelectric substrate;
a package material on which the transmission-side surface acoustic wave filter and the receiving-side surface acoustic wave filter are mounted;
a high-frequency wave element which includes at least one inductor and at least one capacitance element; and
a phase-adjusting strip line disposed in the package material; wherein
the inductor is disposed on the same layers in the package material as that of the phase-adjusting strip line;
the piezoelectric substrates of the transmission-side surface acoustic wave filter and the receiving-side surface acoustic wave filter are LiTaO$_3$ substrates;
the capacitance element includes a comb-shaped electrode disposed on the piezoelectric substrate of one of the transmission-side surface acoustic wave filter and the receiving-side surface acoustic wave filter;
a direction connecting electrode fingers of the comb-shaped electrode is substantially perpendicular to a propagation direction of a surface acoustic wave in the surface acoustic wave filter; and
a pitch of an electrode finger of the comb-shaped electrode falls in any one of the ranges of the following expressions:

$5500/fH \geq 2 \times P$ $6800/fL \leq 2 \times P \leq 16500/fH$ $18800/fL \leq 2 \times P$ where fH is an upper limit frequency of the pass band of the receiving-side surface acoustic wave filter, fL is a lower limit of the pass band of the filter of the transmission-side surface acoustic wave filter, and P is an electrode-finger pitch of the comb-shaped electrode.

15. A surface acoustic wave duplexer comprising:
an antenna terminal;
a transmission-side surface acoustic wave filter connected to the antenna terminal;
a receiving-side surface acoustic wave filter connected to the antenna terminal;
a package material on which the transmission-side surface acoustic wave filter and the receiving-side surface acoustic wave filter are mounted;
at least one phase-matching element; and
a low-pass filter; wherein
the low-pass filter is connected between the antenna terminal and the transmission-side surface acoustic wave filter and between the antenna terminal and the receiving-side surface acoustic wave filter;
the low-pass filter has both of a low-pass filter function and an antenna-matching function; and
the phase-matching element is disposed between a surface acoustic wave filter having a relatively high frequency and an antenna terminal, and an amount of phase delay in the phase-matching element is less than about 90 degrees at a center frequency of a surface acoustic wave filter having a relatively low frequency.

16. A surface acoustic wave duplexer according to claim 15, wherein the amount of phase delay falls within a range of about 60 degrees to about 80 degrees.

17. A surface acoustic wave duplexer comprising:
an antenna terminal;
a transmission-side surface acoustic wave filter connected to the antenna terminal;
a receiving-side surface acoustic wave filter connected to the antenna terminal;
a package material on which the transmission-side surface acoustic wave filter and the receiving-side surface acoustic wave filter are mounted;
at least one phase-matching element; and
a low-pass filter; wherein
the low-pass filter is connected between the antenna terminal and the transmission-side surface acoustic wave filter and between the antenna terminal and the receiving-side surface acoustic wave filter;
the low-pass filter has both of a low-pass filter function and an antenna-matching function; and
an impedance at an antenna terminal of the surface acoustic wave duplexer excluding the low-pass filter is inductive at least in a frequency range of about 50% or more of each pass band width of a transmission-side surface acoustic wave filter and a receiving-side surface acoustic wave filter, an impedance in a pass band of the low-pass filter is capacitive, and matching is obtained on a real axis when, viewed from an antenna side.

18. A surface acoustic wave duplexer comprising:
an antenna terminal;
a transmission-side surface acoustic wave filter connected to the antenna terminal;
a receiving-side surface acoustic wave filter connected to the antenna terminal;
a package material on which the transmission-side surface acoustic wave filter and the receiving-side surface acoustic wave filter are mounted;
a high-frequency wave element which has at least one inductor and at least one capacitance element;
a common connection point connecting one end of the transmission-side surface acoustic wave filter and connecting one end of the receiving-side surface acoustic wave filter; wherein
the high-frequency wave element is disposed only between the common connection point and the antenna terminal;
the inductor is disposed in the package material;

the capacitance element includes a comb-shaped electrode;

a direction of an electrode-finger pitch of the comb-shaped electrode is turned substantially 90 degrees with respect to a propagation direction of the surface acoustic wave;

a ripple which occurs due to the capacitance element is not located at a twofold wave and a threefold wave and in the vicinity of the twofold wave and the threefold wave of a pass band of the transmission-side surface acoustic wave filter and a pass band of the receiving-side surface acoustic wave filter; and the high-frequency wave element has both of a low-pass filter function and an antenna-matching function.

19. A surface acoustic wave duplexer comprising:

an antenna terminal;

a transmission-side surface acoustic wave filter connected to the antenna terminal;

a receiving-side surface acoustic wave filter connected to the antenna terminal;

a package material on which the transmission-side surface acoustic wave filter and the receiving-side surface acoustic wave filter are mounted;

a phase-adjusting strip line disposed in the package material; and high-frequency wave element; wherein the high-frequency wave element has two trap attenuation poles approximately equal to a twofold wave and a threefold wave of the transmission-side pass band;

the high-frequency wave element includes at least first and second inductors and first to third capacitance elements;

the first to the third capacitance elements are connected in a delta-type connection in which two of the capacitance elements are connected to each of first to third common terminals;

the first inductor is connected between the first common terminal and ground potential;

the second inductor is connected between the second and third common terminals;

the second inductor is disposed on the same layers as that of the phase-adjusting strip line disposed in the package material; and a terminal which is connected to the transmission-side signal terminal of the strip line and a terminal which is connected to the transmission-side signal terminal of the second inductor are short-circuited in the package material.

* * * * *